United States Patent [19]
Kobayashi et al.

[11] Patent Number: 5,406,543
[45] Date of Patent: Apr. 11, 1995

[54] OPTICAL HEAD WITH SEMICONDUCTOR LASER

[75] Inventors: Shohei Kobayashi; Takeshi Yamazaki; Masato Miyata, all of Tokyo, Japan

[73] Assignee: Olympus Optical Co., Ltd., Tokyo, Japan

[21] Appl. No.: 224,009

[22] Filed: Apr. 6, 1994

[30] Foreign Application Priority Data

| Apr. 7, 1993 | [JP] | Japan | 5-080639 |
| Apr. 7, 1993 | [JP] | Japan | 5-080640 |
| Apr. 21, 1993 | [JP] | Japan | 5-094385 |
| Jun. 3, 1993 | [JP] | Japan | 5-133435 |

[51] Int. Cl.$^6$ ............. G11B 7/00; H01L 31/16
[52] U.S. Cl. ............ 369/121; 369/122; 369/103; 369/109; 257/84; 257/85; 250/551
[58] Field of Search .......... 369/109, 112, 103, 121, 369/122, 44.27, 44.41; 257/80, 81, 84, 85; 250/494.1, 503.1, 551, 353, 393

[56] References Cited

U.S. PATENT DOCUMENTS

| 4,495,407 | 1/1985 | Kodama et al. | 250/201 |
| 4,667,212 | 5/1987 | Nakamura | 257/458 |
| 4,716,559 | 12/1987 | Hine | 369/121 |
| 4,736,231 | 4/1988 | Ayabe et al. | 257/80 |
| 4,882,723 | 11/1989 | Van Rosmalen | 369/256 |
| 4,893,296 | 1/1990 | Matsumoto et al. | 369/122 |
| 4,967,241 | 10/1990 | Kinoshita et al. | 257/85 |
| 5,304,819 | 4/1994 | Torazawa et al. | 257/81 |

FOREIGN PATENT DOCUMENTS

| 63-32743A | 2/1988 | Japan . |
| 64-27040A | 1/1989 | Japan . |
| 64-89027A | 4/1989 | Japan . |
| 3-112184A | 5/1991 | Japan . |
| 3-187285A | 8/1991 | Japan . |
| 4-248134A | 9/1992 | Japan . |
| 4-307427A | 10/1992 | Japan . |
| 4-321972A | 11/1992 | Japan . |
| 4-351785A | 12/1992 | Japan . |
| 5-120755A | 5/1993 | Japan . |
| 5-151753A | 6/1993 | Japan . |
| 53-07759A | 11/1993 | Japan . |

OTHER PUBLICATIONS

H. Kosaka, et al, "A Single Vertical–Cavity Surface Emitting Laser and a Double Vertical-cavity Photo Transistor," Extended Abstracts (The 40th Spring Meeting, 1993); The Japan Society of Applied Physics and Related Societies, No. 3, JSAP Catalog Number: AP 931107-03.

*Primary Examiner*—Eugene R. LaRoche
*Assistant Examiner*—Tan Nguyen
*Attorney, Agent, or Firm*—Stevens, Davis, Miller & Mosher

[57] ABSTRACT

An optical head for writing and/or reading information on and/or from an optical record medium such as a magneto-optical record medium including a semiconductor substrate, a semiconductor laser mounted on a surface of the semiconductor substrate for emitting a laser beam, an objective lens for projecting the laser beam onto the optical record medium as a fine spot, a plurality of photodetectors firmed in the surface of the semiconductor substrate, and an optical block arranged on said semiconductor substrate to form an integral unit together with said semiconductor substrate. The optical block includes a hologram for diffracting a return beam reflected by said magneto-optical record medium and a polarization beam splitting plane arranged in substantially parallel with an optical axis of a zero order beam emanating from the hologram for splitting a pupil of the hologram. The return beams diffracted by the hologram and split by the polarization beam splitting plane are separately received by the plurality of photodetectors. By processing outputs of the photodetectors, information signal, focusing error signal and tracking error signal can be derived in a reliable and stable manner, while the optical head can be simple in construction, small in size and cheap in cost.

9 Claims, 32 Drawing Sheets

FIG_2
PRIOR ART
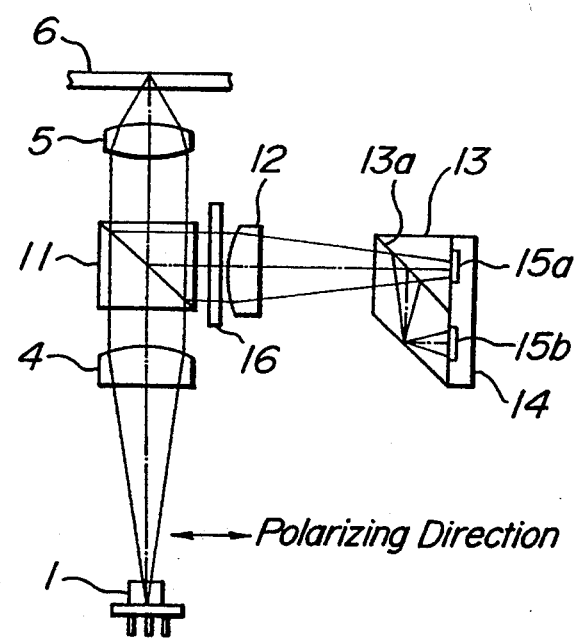
← Polarizing Direction
FIG_3
PRIOR ART
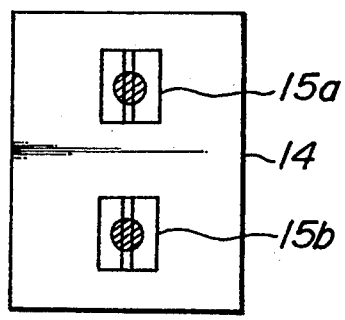

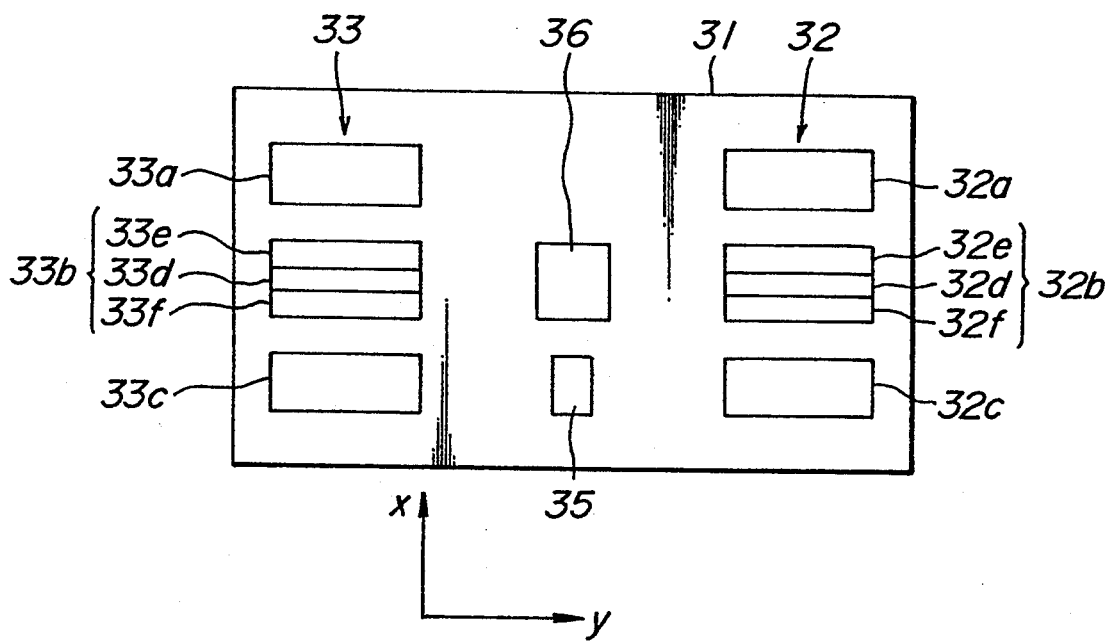
FIG_9
PRIOR ART

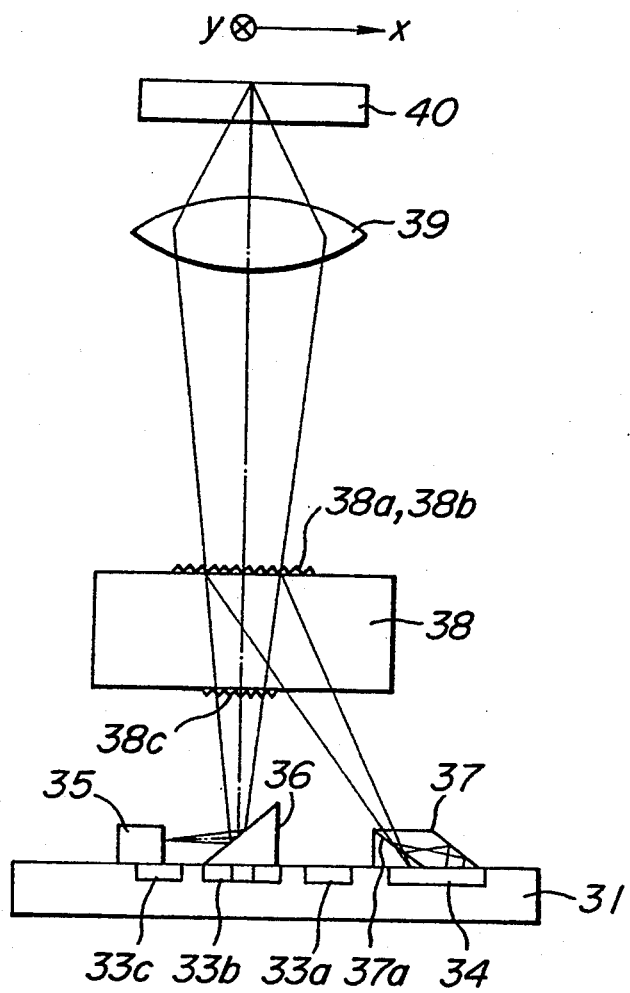
FIG_10

FIG_11
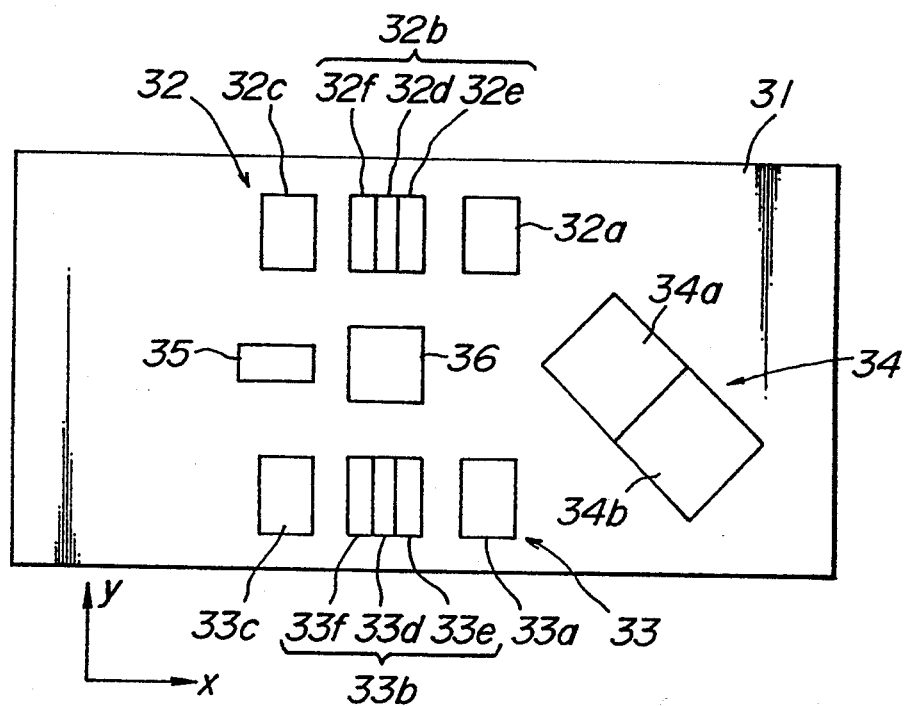
FIG_12
PRIOR ART
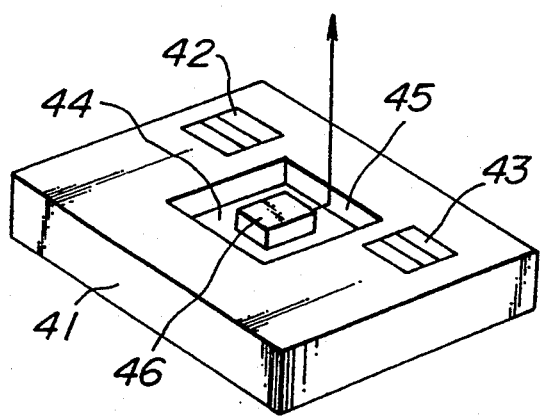

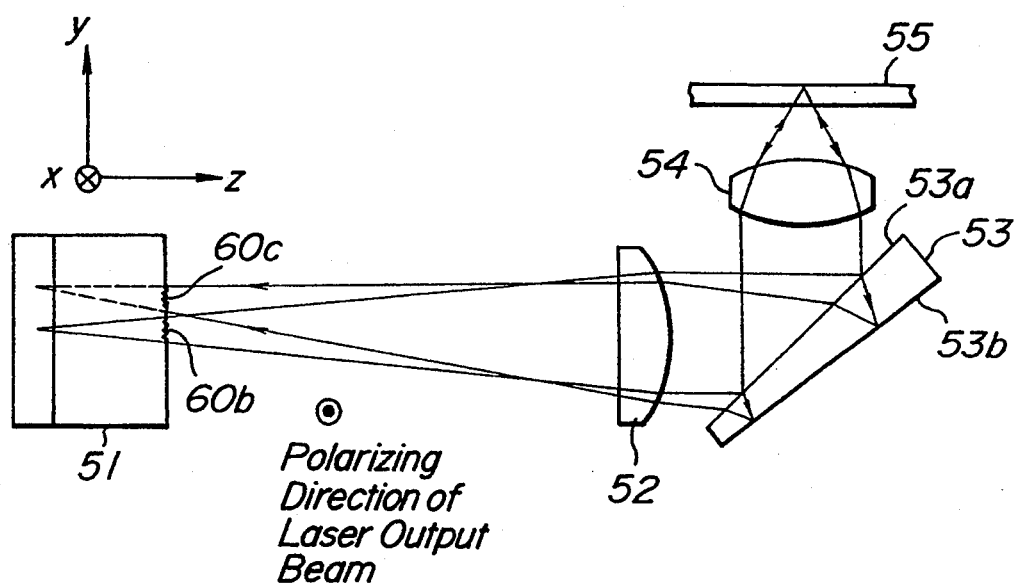
FIG._13

FIG._14
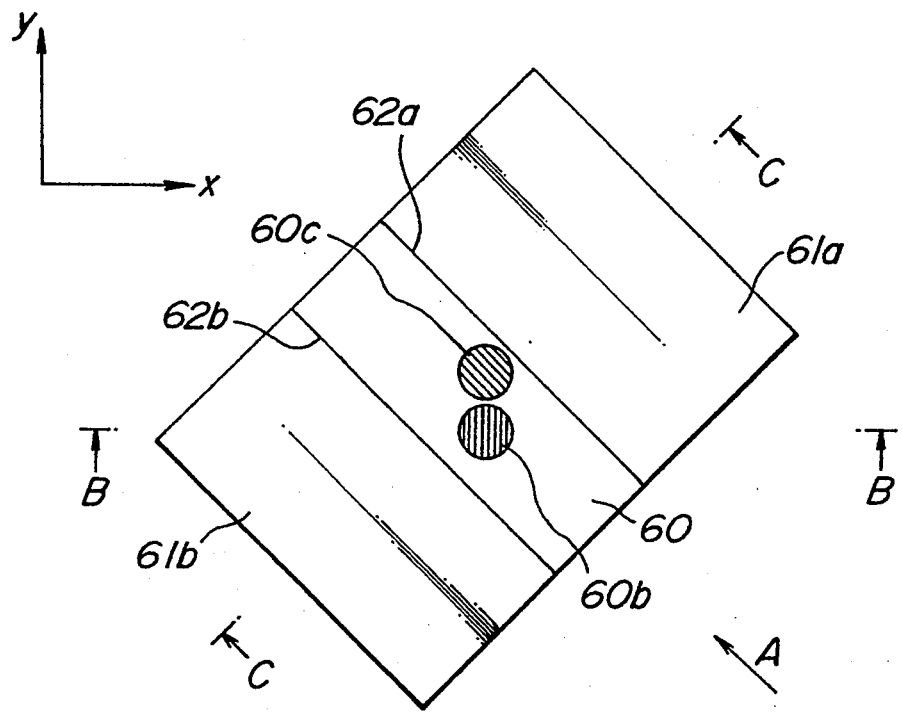
FIG._15
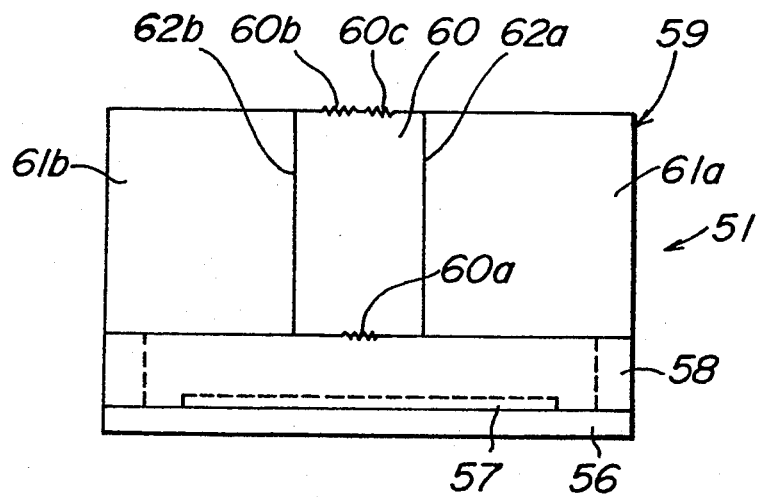

FIG_16
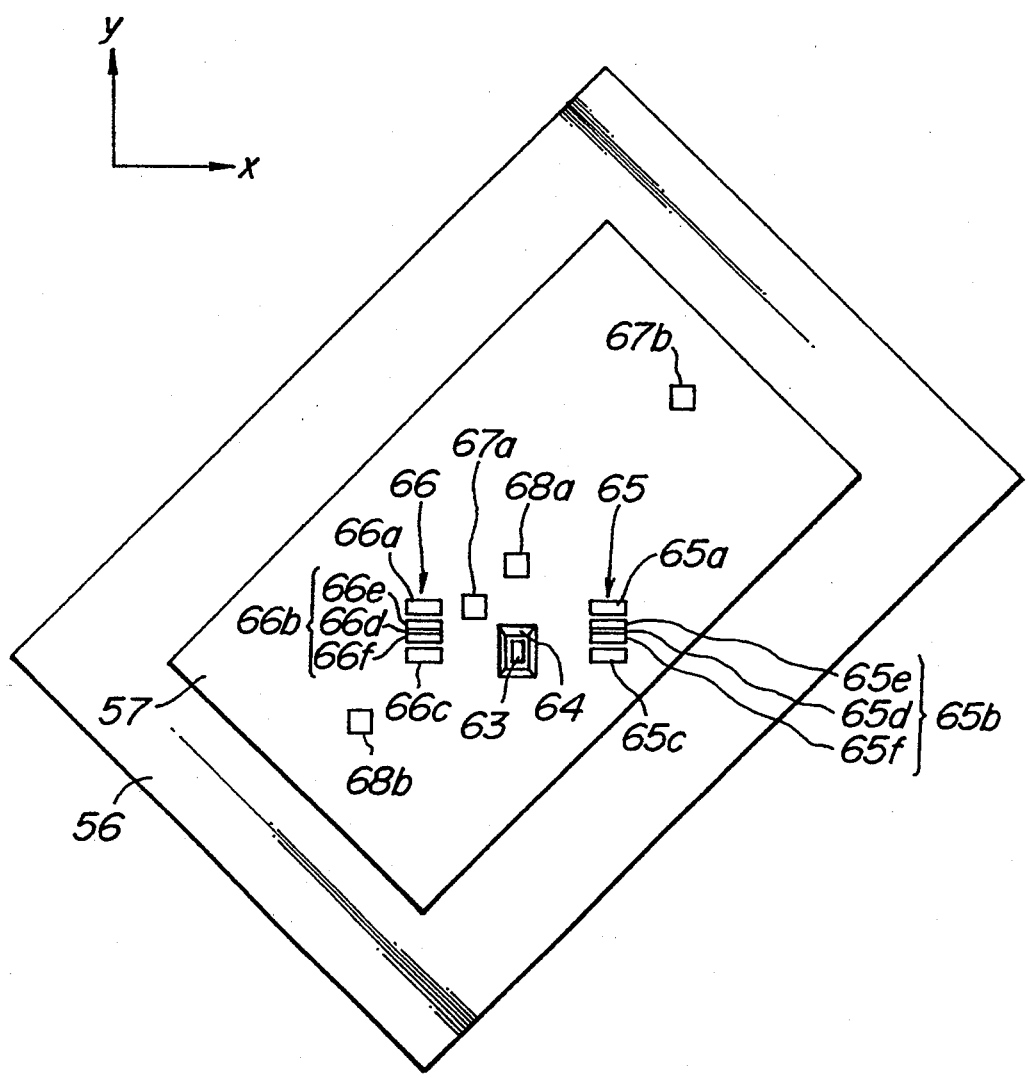

FIG_17
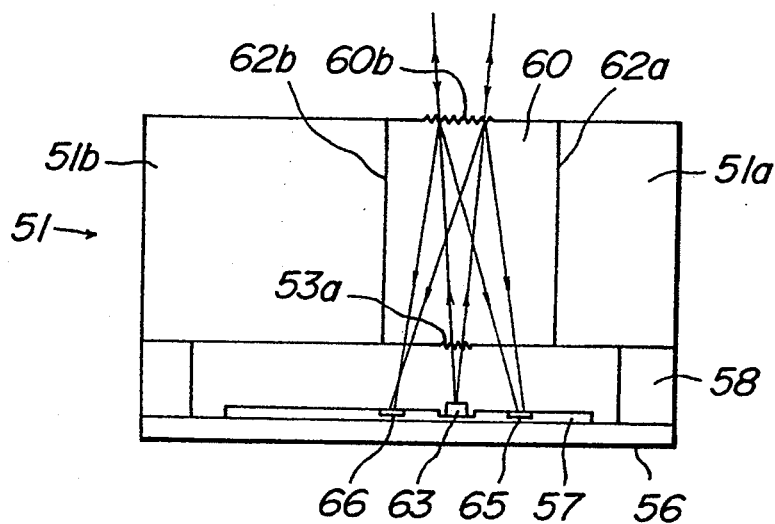
FIG_18
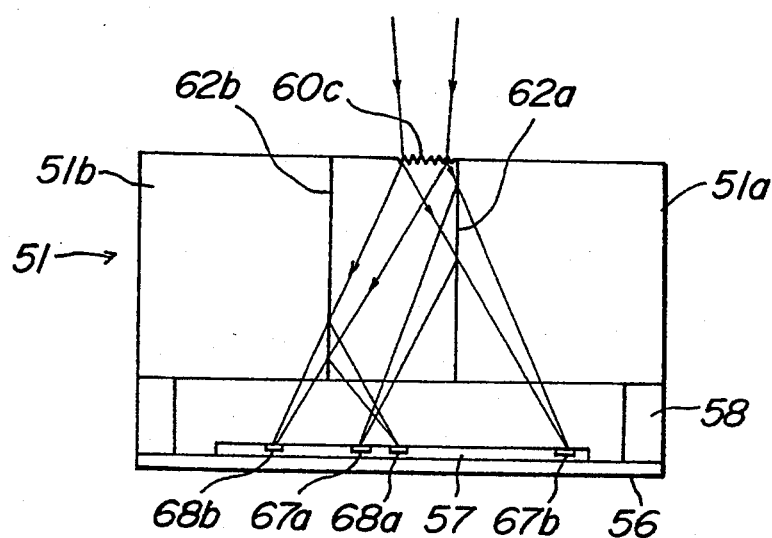

FIG_19
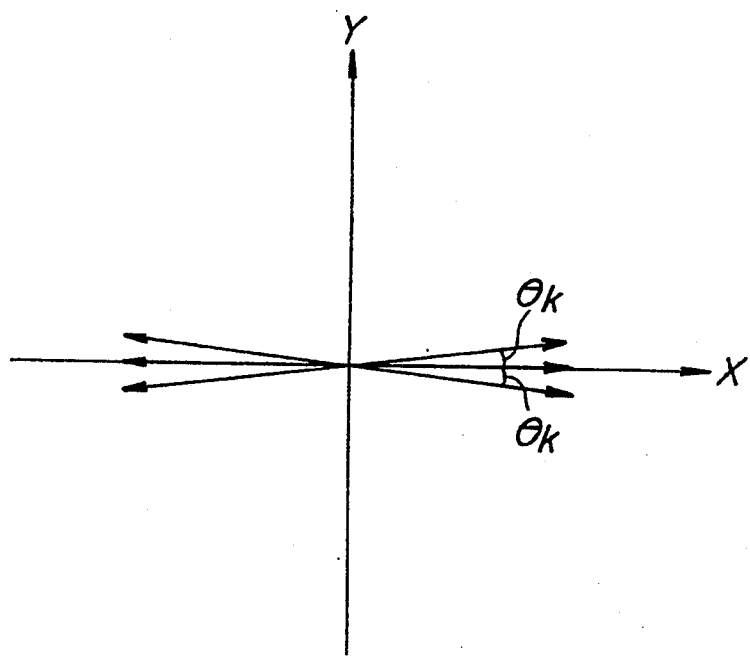
FIG_20
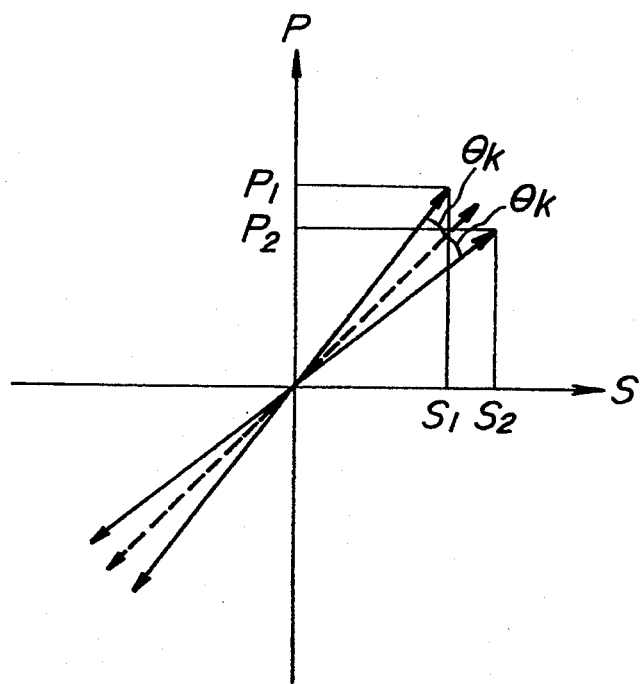

Polarizing Direction of Output Laser Beam

FIG_23

FIG_24

FIG_27
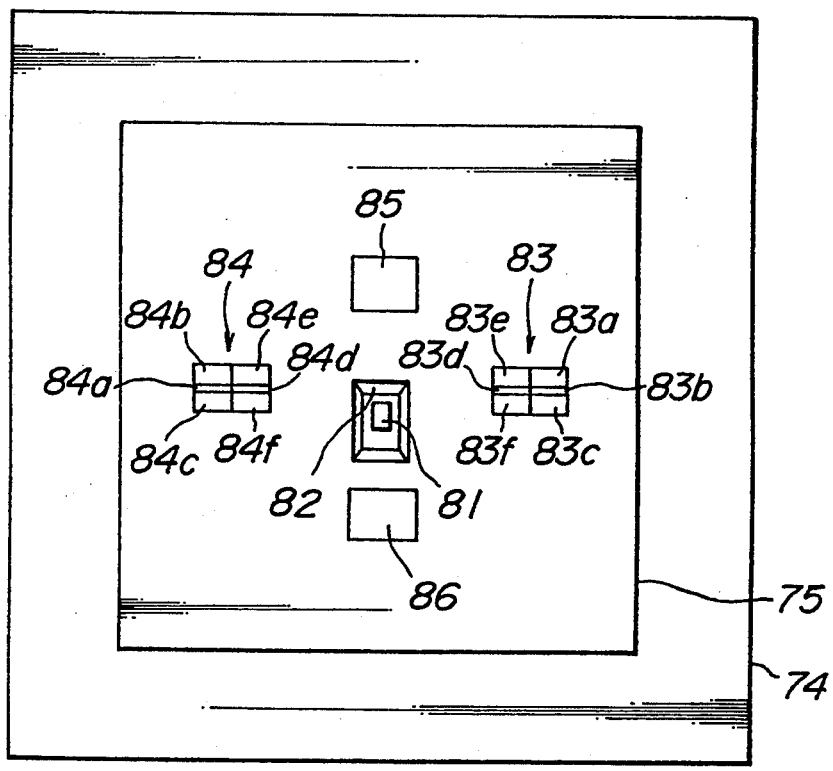

FIG_28
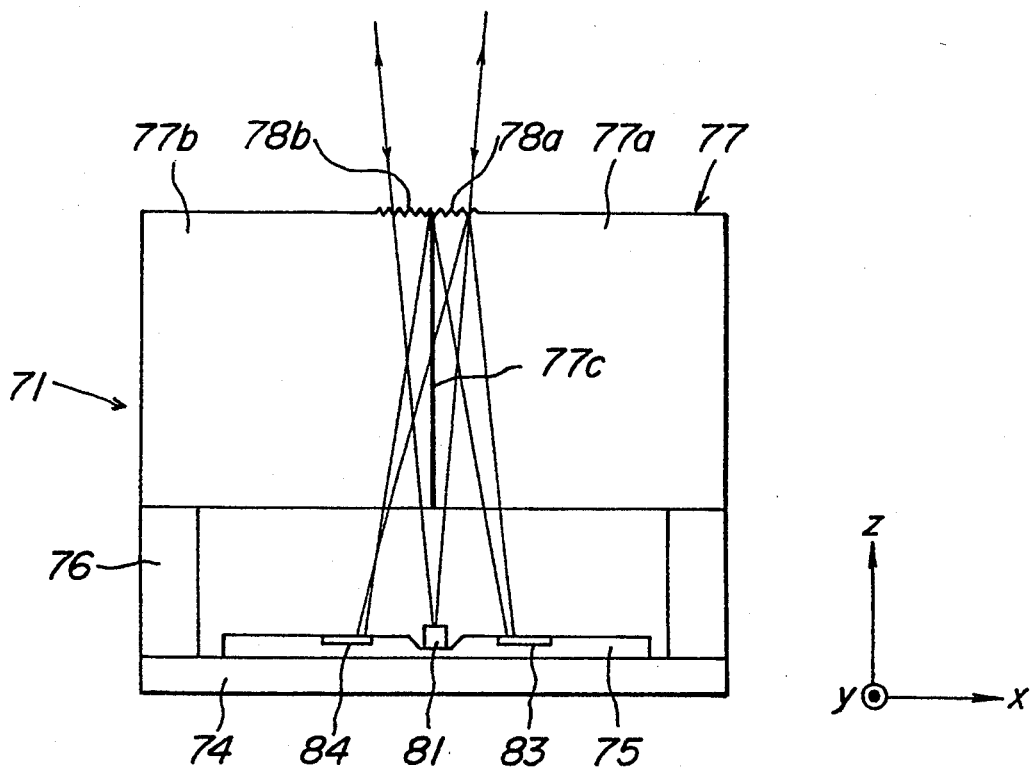
FIG_29
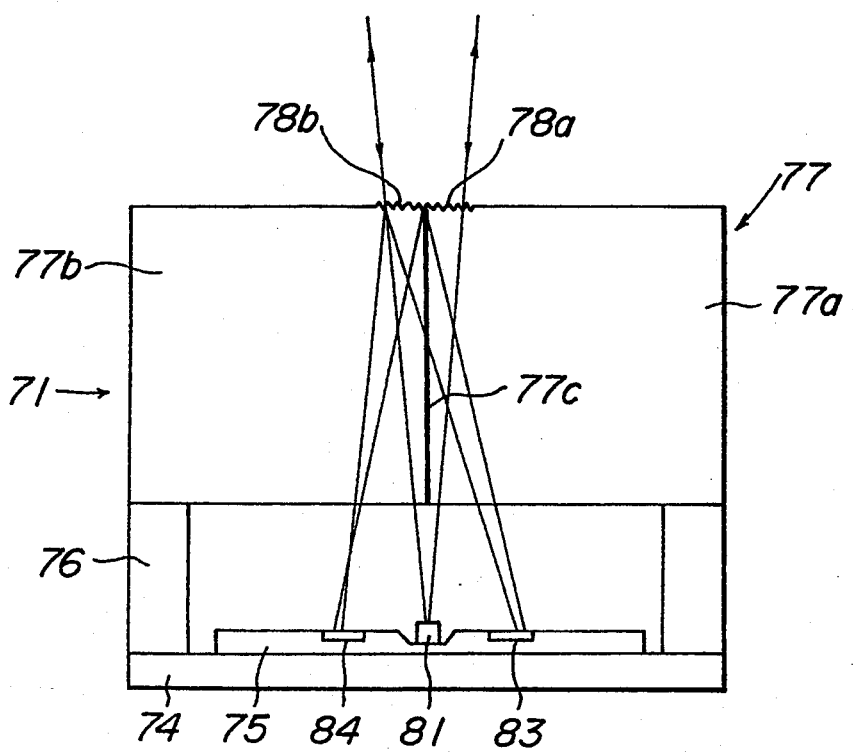

FIG_30
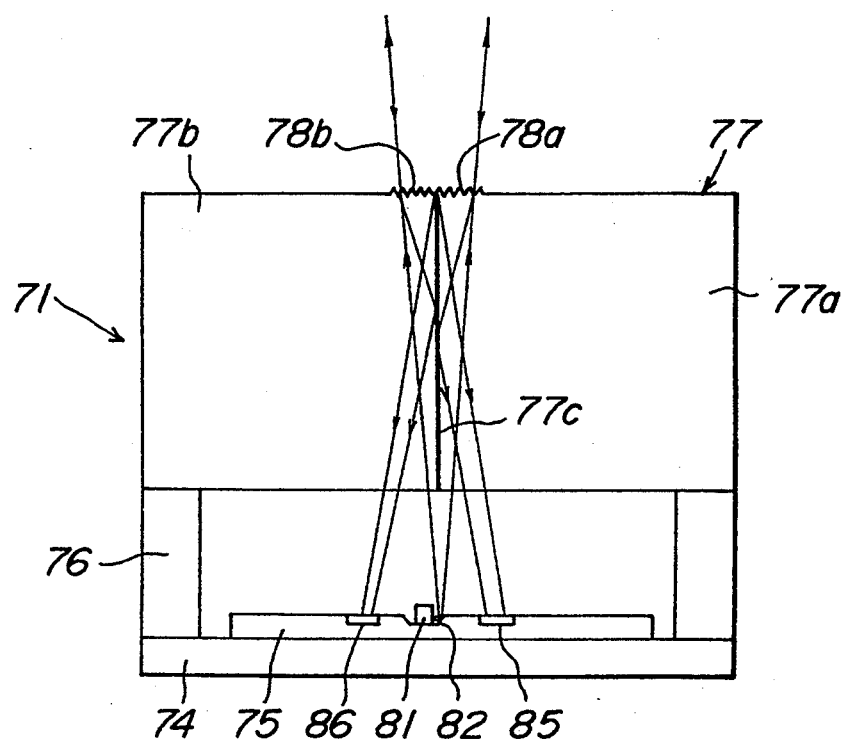

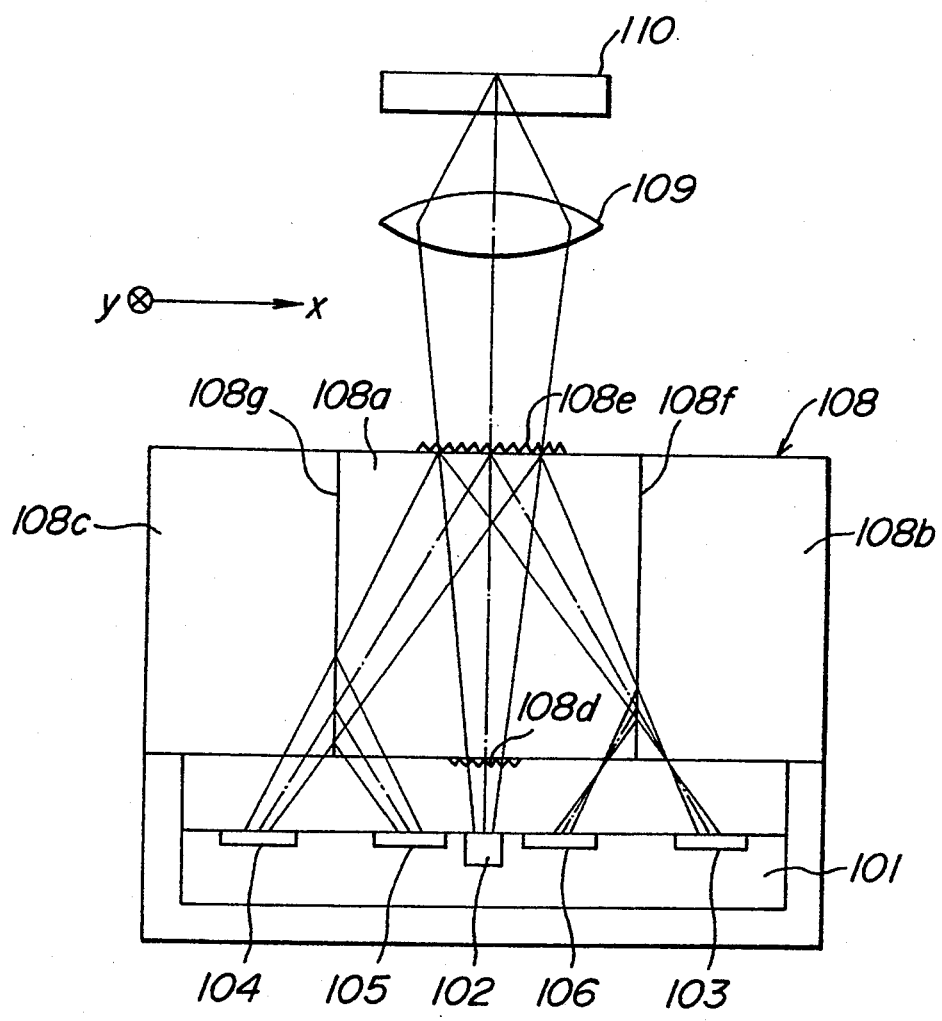
FIG_31

FIG_32
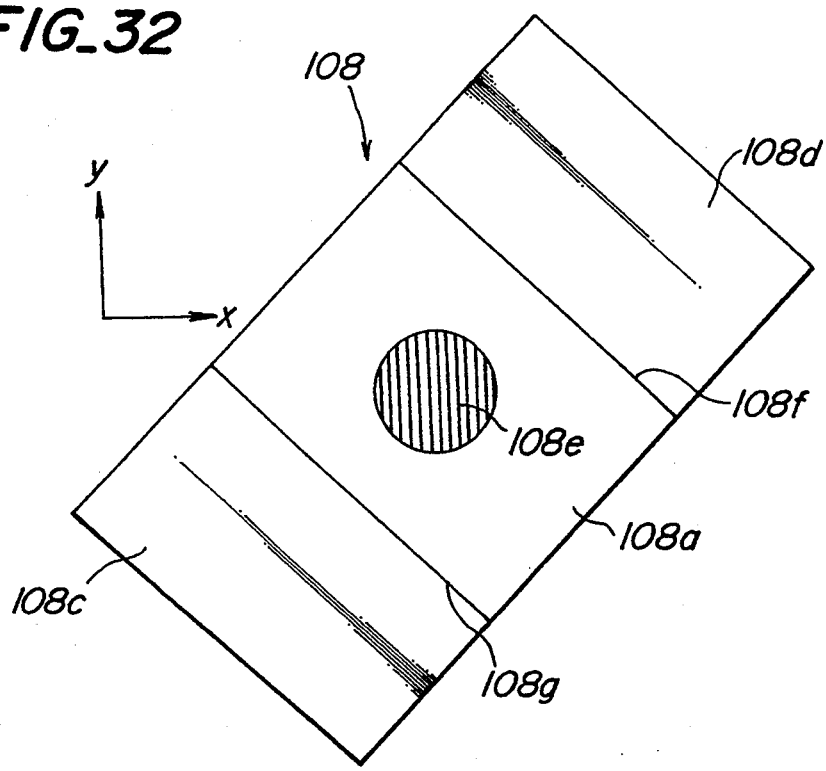
FIG_33
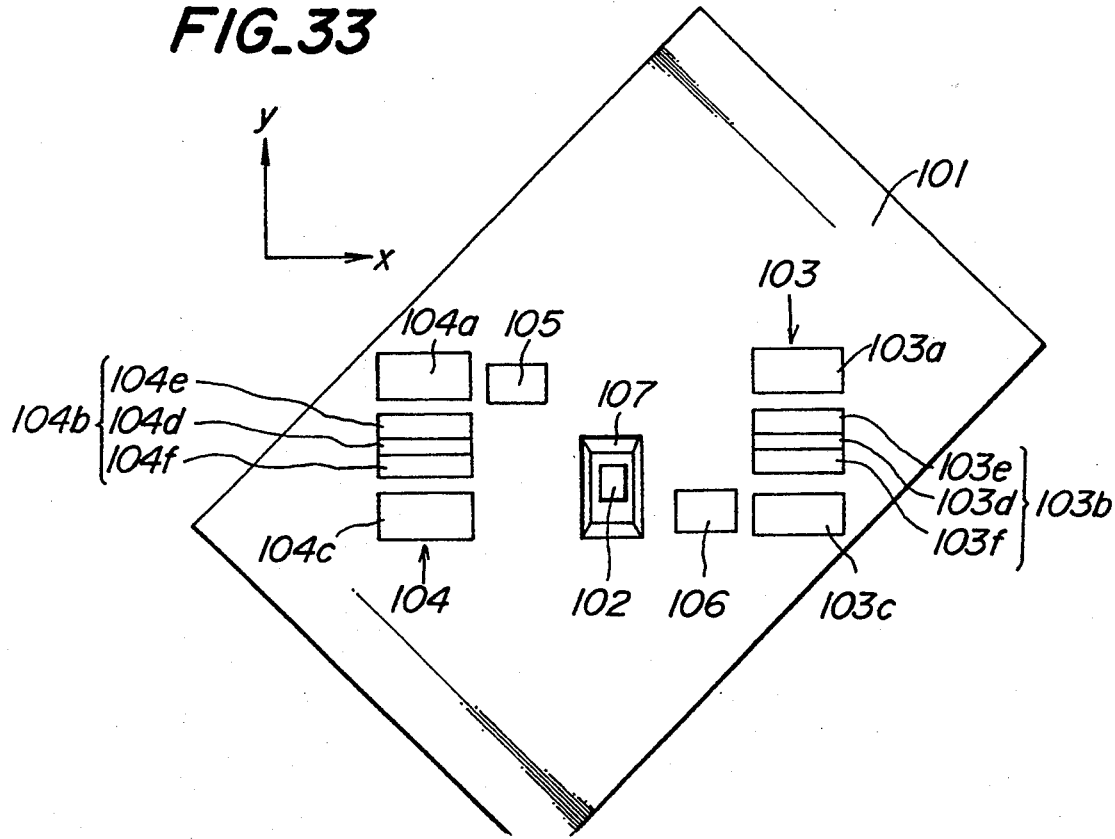

FIG_34
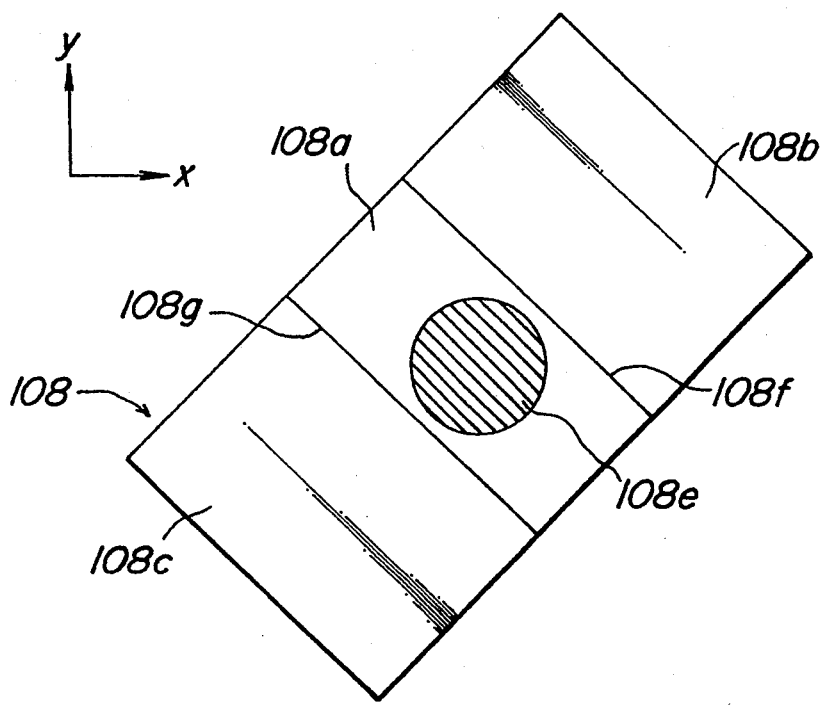
FIG_35
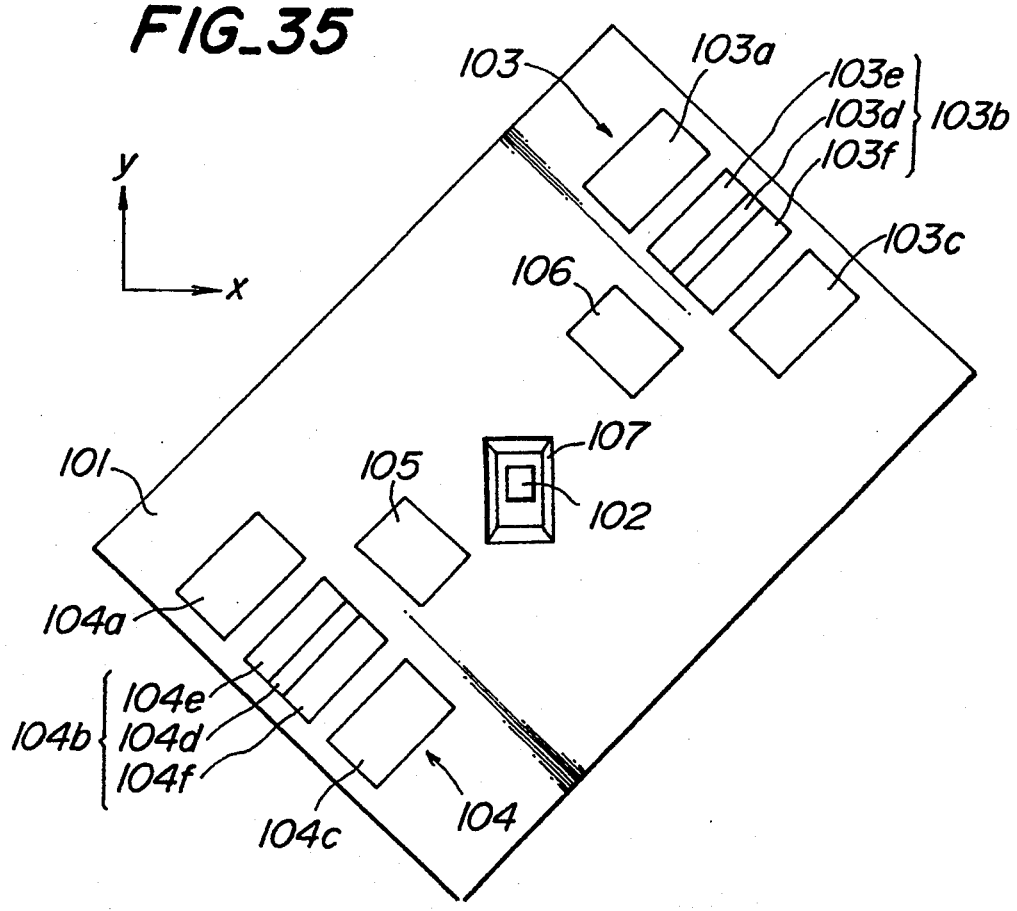

FIG_37

FIG_39

FIG_42

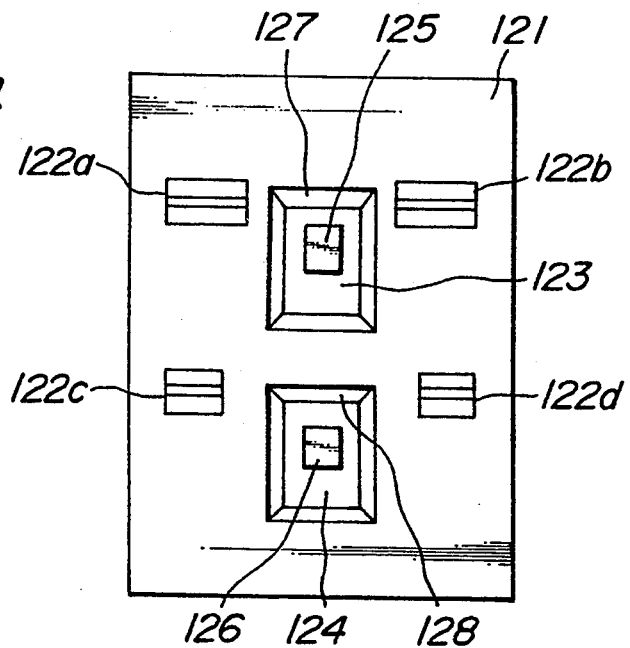
FIG_44
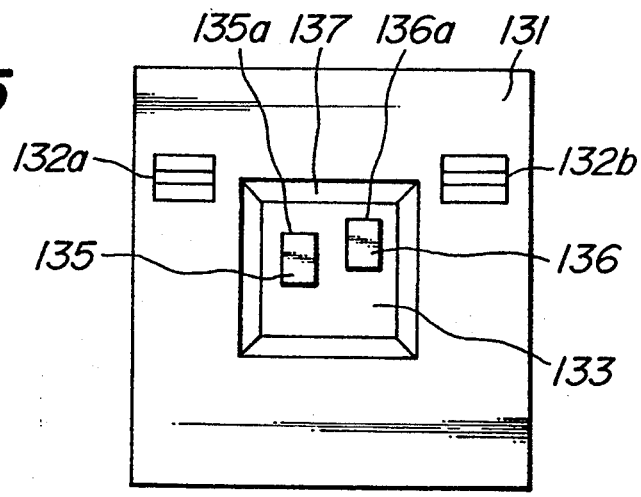
FIG_45

OPTICAL HEAD WITH SEMICONDUCTOR LASER

BACKGROUND OF THE INVENTION

1. Field of the Invention

The present invention relates to an optical head for writing and/or reading information on and/or from an optical record medium comprising a semiconductor laser for emitting a laser beam, a light converging means for converging said laser beam and projecting the thus converged laser beam onto the optical record medium, and a photodetecting means for receiving the laser beam reflected from the optical record medium by means of said light converging means.

2. Related Art Statement

The optical head of the type mentioned above has been widely used for writing and/or reading information on and/or from an optical record medium such as optical disk and optical card.

In Japanese Patent Application Laid-open Publication Kokai Sho 63-32743, there is disclosed a known optical head having a semiconductor laser. As shown in FIG. 1, the optical head includes a semiconductor laser 1 for emitting a diverging laser beam and a lens 2 for converging the laser beam. The laser beam is then transmitted through a hologram 3 and then is converted into a parallel laser beam by means of a collimator lens 4. The parallel laser beam is then made incident upon an objective lens 5 and is projected onto an optical record medium 6 such as a magneto-optical disk as a very fine spot.

The laser beam reflected by the magneto-optical disk 6 is made incident upon the hologram 3 by means of the objective lens 5 and collimator lens 4. Then there are produced plus and minus first order (±1-order) diffracted laser beams having astigmatism contained therein. These ±1-order diffracted laser beams are then made incident upon photodetectors 9 and 10 by means of a polarizing lens 7. The photodetectors 9 and 10 are formed on a substrate 8 and each of them has four divided light receiving regions. An information signal may be obtained from a difference between output signals of the photodetectors 9 and 10 and at the same time a focusing error signal can be obtained by the well-known astigmatism method.

FIGS. 2 and 3 illustrate another known optical head including a semiconductor laser. A laser beam emitted by a semiconductor laser 1 is converted into a parallel laser beam by means of a collimator lens 4 and then is made incident upon an objective lens 5 via a polarizing beam splitter 11. It should be noted that the incident laser beam is of P-polarized beams, so that it is transmitted through the polarizing beam splitter.

The laser beam is then made incident upon a magneto-optical disk 6 by means of an objective lens 5. The laser beam reflected by the magneto-optical disk 6 is made incident upon the polarizing beam splitter 11 by means of the objective lens 5 and is reflected thereby. A polarizing direction of the laser beam reflected by the polarizing beam splitter 11 is rotated by 45 degrees by means of a half-wavelength plate 16 and is then made incident upon a trapezoidal prism 13 by means of a lens 12, said prism having a function for dividing polarized light. The prism 13 has a polarization beam splitting plane 13a which transmits P-polarized component but reflects S-polarized component. The P-polarized component transmitted through the polarization beam splitting plane 13a is made incident upon a photodetector 15a having three divided light receiving regions and the S-polarized component reflected by the polarization beam splitting plane 13a is made incident upon a photodetector 15b also having three light receiving regions. The photodetectors 15a and 15b are formed on a common substrate 14. An information signal can be reproduced by a difference between output signals from the photodetectors 15a and 15b and the focusing error signal can be obtained by the known beam size method.

In this known optical head, the P-polarized laser beam emitted from the semiconductor laser 1 is made incident upon the polarizing beam splitter 11, and thus information about the Kerr rotation contained in the laser beam reflected by the magneto-optical disk 6 is borne by the S-polarized laser beam. Therefore, in order to obtain the information signal having large amplitude and high C/N, it is advantageous to introduce in an efficient manner the S-polarized component into the photodetectors 15a and 15b. Therefore, it is desired to make the reflectance of the polarizing beam splitter 11 for the S-polarized light 100%. To this end, in this known optical pick-up head, transmittance T and reflectance R of the polarizing beam splitter 11 for the P- and S-polarized components are set to, for instance Tp 80%: Ts 0%: Rp 20%: Rs 100%.

In Japanese Patent Application Laid-open Publication Kokai Hei 5-307759 published on Nov. 19, 1993, there is disclosed an optical pick-up head as shown in FIGS. 4 to 7. The optical pick-up head comprises a block like unit 16 of semiconductor laser, photodetectors and holograms and a laser beam emitted by the unit 16 is made incident upon an optical record medium 19 by means of a stop 17 and an objective lens 18. The laser beam reflected by the record medium 19 is then made incident upon the unit 16 by means of the objective lens 18 and stop 17.

As shown in FIG. 5, the unit 16 comprises a substrate 20 on which a semiconductor substrate 21 is provided, and a hologram element 22 is arranged on the substrate 20 via a spacer 23. On the semiconductor substrate 21 there is provided a semiconductor laser 24, and as best shown in FIG. 6 in a surface of the semiconductor substrate there are formed photodetectors 25, 26 and 27 and 28, 29 and 30 on both sides of the semiconductor laser 24 viewed in a tracking direction x, each of said two sets of photodetectors being aligned in a track direction y. The middle photodetectors 26 and 29 have three light receiving regions 26a, 26b and 26c and 29a, 29b and 29c which are divided along lines extending in the direction x. As illustrated in FIG. 7, in the front surface of the semiconductor substrate 21, there is formed a recess 21a with an inclined side wall 21b by etching, and the semiconductor laser 24 is placed on the bottom of the recess 21a. The inclined side wall 21b is polished as a mirror surface, so that a laser beam emitted from the semiconductor laser 24 in a direction parallel with the surface of the semiconductor substrate 21 is reflected by the inclined side wall 21b into a direction which is normal to the surface of the semiconductor substrate 21.

As depicted in FIG. 5, the hologram element 22 comprises on its one surface gratings 22a for dividing the laser beam emitted by the semiconductor laser 24 into three laser beams, i.e. 0-order beam (main beam), +1-order beam and −1-order beam (sub-beams). The hologram element 22 further comprises on its other surface a hologram pattern 22b for diffracting an incident beam and giving the +1-order and −1-order laser beams opposite focal powers.

The laser beam emitted by the semiconductor laser 24 is reflected by the inclined side wall 21b and is then divided by the gratings 22a into the single main beam and two sub-beams, these three beams being made incident upon the optical record medium 19 by means of the stop 17 and objective lens 18. The three laser beams reflected by the record medium 19 are made incident upon the hologram pattern 22b by means of the objective lens 18 and stop 17 and are diffracted thereby. ±1-order beams of the main beam are received by the middle photodetectors 26 and 29, respectively, ±1-order beams of one of the two sub-beams are received by the photodetectors 25 and 28, respectively and ±1-order beams of the other sub-beam are received by the photodetectors 27 and 30, respectively. The focusing error signal is derived from outputs of the photodetectors 26 and 29 in accordance with the beam size method, and the tracking error signal is obtained by output signals from the photodetectors 25, 27, 28 and 30 on the basis of the three beam method.

In the known optical head shown in FIG. 1, the laser beam reflected by the magneto-optical record disk 6 is made incident upon the photodetectors 9 and 10 after being diffracted by the hologram 3. The hologram 3 is of a thin type in which a depth of the recesses is smaller than a wavelength, and thus the diffraction efficiency for the ±1-order diffracted beams (an amount of ±1-order diffracted light/an amount of incident light) is not dependent upon the polarizing condition, so that a polarized component containing information about the Kerr rotation could not be completely introduced onto the photodetectors 9 and 10. Therefore, the magneto-optical information signal has a small amplitude, and thus C/N of the signal becomes decreased.

In order to mitigate the above mentioned drawback, it is considered that the diffraction coefficient for the ±1-order diffracted beams of the hologram 3 is increased, but then the diffraction coefficient for the 0-order beam (an amount of the 0-order light/an amount of incident light) would be deceased and a necessary laser power for writing information might become high and a problem of heat generation and so on might occur.

In the known optical head illustrated in FIGS. 2 and 3, the laser beam reflected by the magneto-optical record medium 6 is made incident upon the photodetectors 15a and 15b by means of the polarizing beam splitter 11, and therefore the polarized component bearing the information about the Kerr rotation could be effectively received by the photodetectors. However, the optical path is bent at right angles by the polarizing beam splitter 11, and thus a size of the optical head is liable to be large. Further, the semiconductor laser 1 and the photodetectors 15a, 15b are formed separately form each other, they are liable to be deviated from each other due to temperature variation and secular variation, and thus a reliability of the optical head is low.

In the optical pick-up head shown in FIGS. 4 to 7, the semiconductor laser 24, photodetectors 25–30 and hologram element 22 are all integrated into the single unit 16, and thus the optical head can be made small in size and the reliability can be improved. However, there is not disclosed a concrete construction for deriving the magneto-optical information signal.

Therefore, a primary object of the present invention is to provide a novel optical head for mitigating the above mentioned drawbacks of the known optical head, in which the head can be made small in size, a high reliability can be attained, the decrease in C/N can be suppressed and the magneto-optical information can be read out stably.

According to one aspect of the present invention, an optical head comprises:

a semiconductor substrate having a surface;

a semiconductor laser arranged on said surface of the semiconductor substrate for emitting a laser beam;

a light receiving means including a plurality of photodetectors formed in said surface of the semiconductor substrate;

a collimator lens for converting said laser beam emitted by said semiconductor laser into a substantially parallel laser beam;

an objective lens for converging said substantially parallel laser beam onto a magneto-optical record medium;

a beam dividing means arranged between said collimator lens and said objective lens for dividing a laser beam reflected by said magneto-optical record medium into first and second return beams; and a polarization beam splitting means arranged between said semiconductor laser and said collimator lens such that an integral unit is formed together with said semiconductor substrate, and including gratings for diving the laser beam emitted by said semiconductor laser into a main beam which is used to write or read information on or from said magneto-optical record medium and sub-beams which are used to derive a tracking error signal, a first hologram pattern for diffracting said first return beam, a second hologram pattern for diffracting said second return beam, and a polarization beam splitting plane arranged substantially in parallel with an optical axis of a zero order beam emanating from said second hologram pattern for splitting +1-order and/or −1-order diffracted beam emanating from said second hologram pattern in accordance with a polarizing direction of the beam; whereby +1-order and −1-order diffracted beams emanating from said first hologram pattern and beams emanating from said polarization beam splitting plane are separately received by said plurality of photodetectors of said light receiving means.

According to another aspect of the invention, an optical head comprises:

a semiconductor substrate having a surface;

a semiconductor laser arranged on said surface of the semiconductor substrate for emitting a laser beam;

a light receiving means including a plurality of photodetectors formed in said surface of the semiconductor substrate;

a collimator lens for converting said laser beam emitted by said semiconductor laser into a substantially parallel laser beam;

an objective lens for converging said substantially parallel laser beam emanating from said collimator lens onto a magneto-optical record medium;

a beam dividing means arranged between said collimator lens and said objective lens for dividing a laser beam reflected by said magneto-optical record medium into first and second return beams; and a polarization beam splitting means arranged between said semiconductor laser and said collimator lens such that an integral unit is formed together with said semiconductor substrate, and including a first hologram pattern for diffracting said first return beam, a second hologram pattern for diffracting said second return beam, a third hologram pattern for diffracting a zero order beam emanating from said first hologram pattern, and a polarization beam splitting plane arranged substantially in parallel with an optical axis of a zero order beam emanating from said second hologram pattern for splitting +1-order and/or −1-order diffracted beams emanating from said second hologram pattern in accordance with a polarizing direction of the beam; whereby 1-order and −1-order diffracted beams emanating from said first hologram pattern, beams emanating from said polarization beam splitting plane and +1-order and/or −1-order diffracted beam emanating from said third hologram pattern are separately received by said plurality of photodetectors of said light receiving means.

According to another aspect of the invention, an optical head comprises:

a semiconductor substrate having a surface;

a semiconductor laser arranged on said surface of the semiconductor substrate for emitting a laser beam;

a light receiving means including a plurality of photodetectors formed in said surface of the semiconductor substrate;

an objective lens converging the laser beam emitted by said semiconductor laser onto a magneto-optical record medium; and an optical block arranged to form an integral unit together with said semiconductor substrate and including a hologram for diffracting a return beam reflected by said magneto-optical record medium and a polarization beam splitting plane arranged in substantially parallel with an optical axis of a zero order beam emanating from said hologram for splitting a pupil of said hologram; wherein return beams diffracted by said hologram and split by said polarization beam splitting plane are separately received by said plurality of photodetectors of said light receiving means.

In Japanese Patent Application Laid-open Publication Kokai Hei 4-248134 published on Sep. 3, 1992, there is disclosed another known optical head. As shown in FIGS. 8 and 9, this known optical head comprises a semiconductor substrate 31 in which first and second photodetectors 32 and 33 are formed. On the semiconductor substrate 31 there are arranged semiconductor laser 35 and reflection mirror 36. A laser beam emitted by the semiconductor laser 35 is reflected by the mirror 36 upwardly toward an optical record medium 40 by means of hologram element 38 and objective lens 39.

The hologram element 38 has formed thereon a hologram pattern 38a on a surface facing the objective lens 39 and gratings 38c on a surface facing the substrate 31. The gratings 38c serve to divide the laser beam emitted by the semiconductor laser 35 into a main beam and two sub-beams, these three beams being made incident upon the optical record medium 40 by means of the objective lens 39. The three laser beam reflected by the optical record medium 40 are made incident upon the hologram element 38 by means of the objective lens 39. Each of these beams is divided into ±1-order beams having opposite refraction powers. 1-order beams are received by the first photodetector 32 and −1-order beams are received by the second photodetector 33. The photodetector 32 comprises three light receiving elements 32a, 32b and 32c for receiving the three +1-order beams, and the middle light receiving element 32b for receiving the +1-oder beam of the main beam has three light receiving regions 32d, 32e and 32f which are divided in the same direction as the diffracting direction of the hologram pattern 38a. Similarly, the photodetector 33 comprises three light receiving elements 33a, 33b and 33c for receiving the three −1-order beams, and the middle light receiving element 33b for receiving the −1-oder beam of the main beam has three light receiving regions 33d, 33e and 33f which are divided in the diffracting direction of the hologram pattern 38a.

Then, the focusing error signal can be derived from output signals of the light receiving regions 32d, 32e and 32f of the light receiving element 32b for receiving the +1-order beams of the main beam and output signals of the light receiving regions 33d, 33e and 33f of the light receiving element 33b for receiving the −1-order beams of the main beam on the basis of the beams size method. Further the tracking error signal is derived from output signals from the light receiving elements 32a and 32c for receiving the +1-order beams of the two sub-beams and output signals from the light receiving elements 33a and 33c for receiving the −1-order beams of the two sub-beams in accordance with the three beam method. In FIGS. 8 and 9, a direction in which information tracks extend is denoted by x and a tracking direction perpendicular to the direction x is represented by y.

This known optical head can be constructed from a smaller number of parts, and further the semiconductor laser 35 and photodetectors 32 and 33 are provided on the same semiconductor substrate 31, so that the optical head can be made small in size. Moreover, even if the diffraction angles by the hologram pattern 38a for the ±1-order diffracted beams are changed due to the variation in the wavelength of the laser beam emitted from the semiconductor laser 35, the images on the photodetectors 32 and 33 move in the direction which is parallel with the dividing lines of the photodetectors, and therefore the focusing error signal is hardly affected by the fluctuation of the wavelength. Furthermore, even if the spots on the photodetectors 32 and 33 are shifted due to errors in machining various parts and in assembling, the +1-order beams and −1-order beams are shifted in the same manner, and thus it is possible to cancel out offsets of the focusing error signal from the +1-order beams and of the focusing error signal from the −1-order beams. In this manner, the signal detection can be performed stably and adjustment of various parts during the assembling can be simplified.

This known optical head could be applied to the compact disk device and once-write type disk device, but could not be utilized for the magneto-optical disk device, because the optical head does not comprise the polarizing splitting means.

In Japanese Patent Application Laid-open Publication Kokai Hei 5-120755 published on May 18, 1993, there is disclosed another optical head which could be used for the magneto-optical disk. As depicted in FIGS. 10 and 11, this optical head comprises a semiconductor substrate 31 in which first, second and third photodetectors 32, 33 and 34 are formed. On the semiconductor substrate 31 there are arranged semiconductor laser 35, reflection mirror 36 and polarizing beam splitter 37. A laser beam emitted by the semiconductor laser 35 is reflected by the mirror 36 upwardly toward an optical record medium 40 by means of hologram element 38 and objective lens 39. It should be noted that the optical record medium 40 is formed by the magneto-optical disk. On one surface of the hologram element 38 there are formed hologram patterns 38a and 38b and on the other surface there are formed gratings 38c. The function of the hologram element 38 is substantially same as that of the known optical head illustrated in FIGS. 8 and 9. Further the construction of the first and second photodetectors 32 and 33 are similar to that of the optical head shown in FIGS. 8 and 9 and receive the three 1-order beams and three −1-order beams, respectively.

The third photodetector 34 comprises two light receiving regions 34a and 34b which are inclined by 45 degrees with respect to the directions x and y. On the third photodetector 34, there is arranged the polarizing beam splitter 37 such that a polarization beam splitting plane 37a of multiple coatings of dielectric films is inclined by 45 degrees with respect to the direction y.

The focusing error signal can be obtained from output signals of the light receiving regions 32d, 32e and 32f of the light receiving element 32b for receiving the +1-order beams of the main beam and output signals of the light receiving regions 33d, 33e and 33f of the light receiving element 33b for receiving the −1-order beams of the main beam on the basis of the beams size method, and the tracking error signal can be derived from output signals from the light receiving elements 32a and 32c for receiving the +1-order beams of the two sub-beams and output signals from the light receiving elements 33a and 33c for receiving the −1-order beams of the two sub-beams in accordance with the three beam method. P-polarized component of the +1-order beam of the main beam which is transmitted through the plane 37a of the polarizing beam splitter 37 is received by the light receiving region 34a and S-polarized component reflected by the plane 37a is received by the light receiving region 34b. Now it is assumed that output signals from these light receiving regions 34a and 34b are denoted by Ia and Ib, respectively. Then, the magneto-optical information signal S is obtained as a difference between these signals, i.e. S=Ia−Ib.

In this optical head, since the polarizing beam splitter 37 is provided, it is possible to apply to the magneto-optical disk. However, an operation of mounting the small polarizing beam splitter having a complicated shape on the photodetector 34 is very cumbersome and requires a human skill and a long time, which apparently increases a cost of the optical head.

It is another object of the invention to provide a novel and useful optical head which can be effectively applied to the magneto-optical disk and can be easily assembled without difficult adjustment in a less expensive manner.

According to further aspect of the invention, an optical head comprises:

a semiconductor laser for emitting a laser beam;

a converging means for converging said laser beam emitted by the semiconductor laser onto a magneto-optical record medium;

a light receiving means for receiving a return beam reflected by said magneto-optical record medium and converged by said converging means;

a diffracting means arranged between said semiconductor laser and said converging means for diffracting said return beam reflected by said magneto-optical record medium; and a polarization beam splitting means having a polarization beam splitting plane which is substantially in parallel with an optical axis of a zero order beam of the return beam emanating from said diffracting means and splits diffracted beams emanating from said diffracting means in accordance with polarizing directions of said diffracted beams.

In this optical head according to the invention, the polarization beam splitting plane is arranged to be substantially in parallel with the optical axis of the zero order beam emanating from the diffracting element, and thus an incident angle of an incident beam upon the polarization beam splitting plane can be made large. Therefore, the polarization beam splitting plane can be manufactured easily and the positional adjustment of the light receiving elements with respect to the polarization beam splitting element can be simplified. Moreover, the diffracting element and the polarization beam splitting element may be formed into a single unit, so that the optical head can be made compact in construction and cheap in cost.

The present invention also relates to a light emitting and receiving device for use in the optical head.

FIG. 12 is a perspective view showing a known light emitting and receiving device, which is described in Japanese article "Extended Abstracts (40th Spring Meeting, 1993) 29p-c-12; The Japan Society of Applied Physics and Related Societies No. 3)" held on March 39 to Apr. 1, 1993 at Tokyo, Japan. In this known device, in a surface of a silicon semiconductor substrate 41, there are formed photodetectors 42 and 43 and a recess 44 having a side wall 45 which is inclined by 45 degrees with respect to the surface of the substrate, and on a bottom of the recess is arranged a semiconductor laser 46. It should be noted that inclined side wall 45 serves as a micromirror for reflecting a laser beam emitted from the semiconductor laser 46 in a direction parallel with the surface of the silicon substrate 41 and the reflected laser beam propagates in a direction perpendicular to the surface of the substrate. In this manner, the light emitting and receiving device is realized which comprises a surface emitting type laser element and a photoelectric element.

In Japanese Patent Application Laid-open Publication Kokai Hei 3-187285, there is disclosed a multibeam semiconductor laser device in which a plurality of laser diodes are integrated as a monolithic device. In Japanese Patent Application Laid-open Publication Kokai Hei 3-112184, there is shown a semiconductor laser device in which three semiconductor lasers are integrated on a sub-mount such that light emitting points are deviated from each other.

In the known light emitting and receiving device illustrated in FIG. 12, only one semiconductor laser is provided, so that this device could not be utilized in such a case that a plurality of semiconductor lasers have to be arranged close to each other. In another known laser device disclosed in the Japanese Patent Application Laid-open Publication Kokai Hei 3-187285, there is a limitation that the light emitting points have to be aligned along a line perpendicular to an optical axis. Further, in another known semiconductor laser device described in the Japanese Patent Application Laid-open Publication Kokai Hei 3-112184, it is possible to arrange the light emitting points in a three-dimensional manner, but two semiconductor lasers have to be positioned with respect to the middle semiconductor laser, so that if these semiconductor lasers have to be arranged such that they are separated from each other by comparatively large distances, a precision of the positioning might be decreased. Moreover, the three semiconductor lasers on the sub-mount are positioned with respect to optical axes by utilizing a difference in a thickness of base substrates, and thus the precession of the positioning in a direction perpendicular to the optical axis is affected by the precision of manufacturing the base substrates.

Therefore, the present invention has for its object to provide a novel and useful light emitting and receiving device, in which light emitting points of a plurality of semiconductor lasers can be arranged in a three-dimensional manner, while the precision of positioning of the semiconductor lasers and the precision of positioning the semiconductor lasers and light receiving element can be improved.

According to the invention, a light emitting and receiving device comprises:

a semiconductor substrate having a surface;

a plurality of recesses formed in said surface of the semiconductor substrate;

at least one photodetector formed in said surface of the semiconductor substrate at a position outside said recesses; and a plurality of semiconductor lasers arranged on bottoms of said recesses for emitting laser beams.

According to one aspect of the invention, a depth of at least one recess differs from that of the remaining recesses or a distance between at least one inclined side wall of a recess and an end surface of a semiconductor laser arranged in the relevant recess differs from a distance between at least one inclined side wall of other recess and an end surface of a semiconductor laser arranged in the relevant recess. Then, it is possible to obtain a surface emitting type laser and in which a plurality of light emitting points can be precisely arranged in a three-dimensional manner and can be precisely positioned with respect to the light receiving element.

According to another aspect of the invention, a light emitting and receiving device comprises:

a semiconductor substrate having at least one recess formed in one surface thereof;

at least one photodetectors formed in said surface at a position outside said recess; and a plurality of semiconductor lasers arranged on bottoms of said recess for emitting laser beams.

In this light emitting and receiving device according to the invention, a semiconductor laser is arranged such that its end surface is not in the same plane as that of other semiconductor laser, so that a surface emitting type laser can be realized in which a plurality of light emitting points can be precisely arranged in a three-dimensional manner and can be precisely positioned with respect to the light receiving element.

BRIEF DESCRIPTION OF THE DRAWINGS

FIG. 2 is a schematic view illustrating another known optical head;

FIG. 3 is a plan view depicting a photodetecting means shown in FIG. 2;

FIG. 9 is a plan view of a light emitting and receiving device shown in FIG. 8;

FIG. 10 is a schematic view depicting an optical head disclosed in another prior application;

FIG. 11 is a plan view showing a light emitting and receiving device shown in FIG. 10;

FIG. 12 is a perspective view depicting a known light emitting and receiving device;

FIG. 13 is a schematic view showing a first embodiment of the optical head according to the invention;

FIG. 14 is a plan view illustrating the optical block of FIG. 13;

FIG. 15 is a side view depicting the optical block;

FIG. 16 is a plan view representing the light receiving means of FIG. 13;

FIGS. 17 and 18 are cross sectional views cut along lines B—B and C—C, respectively in FIG. 16;

FIGS. 19 and 20 are diagrams explaining the Kerr rotation;

FIG. 27 is a plan view representing the light receiving means;

FIG. 28 is a cross sectional view for explaining the operation of the optical block shown in FIG. 26;

FIGS. 29 and 30 are across sectional views cut along lines C—C and B—B, respectively in FIG. 26;

FIG. 31 is a schematic view showing a fifth embodiment of the optical head according to the invention;

FIG. 32 is a plan view of the optical block of FIG. 31;

FIG. 33 is a plan view illustrating the light receiving means of FIG. 31;

FIG. 34 is a plan view depicting an optical block of a sixth embodiment of the optical head according to the invention;

FIG. 35 is a plan view of a light receiving means of the sixth embodiment;

FIG. 44 is a plan view illustrating another embodiment of the light emitting and receiving device according to the invention;

FIG. 45 is a plan view showing another embodiment of the light emitting and receiving device according to the invention.

DESCRIPTION OF THE PREFERRED EMBODIMENTS

Figure 1:
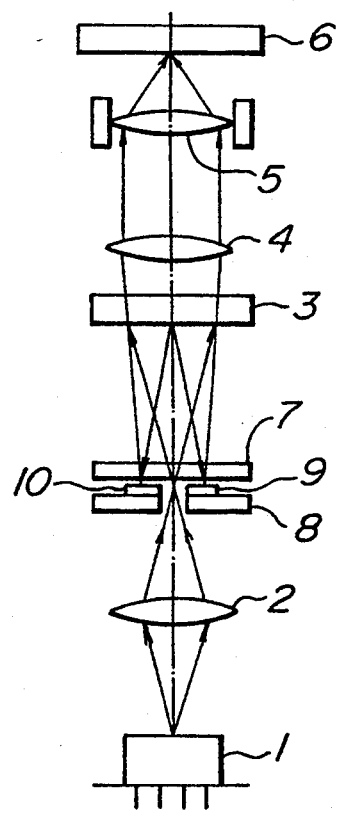
FIG. 1 is a schematic view showing a known optical head.
Figure 4:
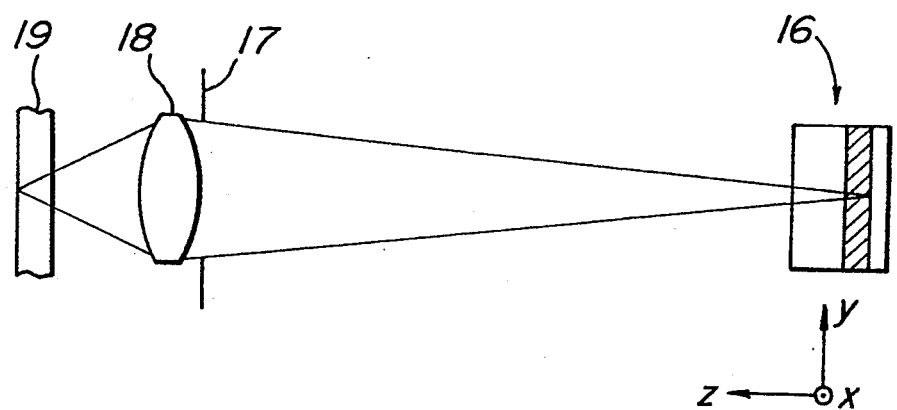
FIG. 4 is a schematic view representing an optical head disclosed in a prior application.
Figure 5:
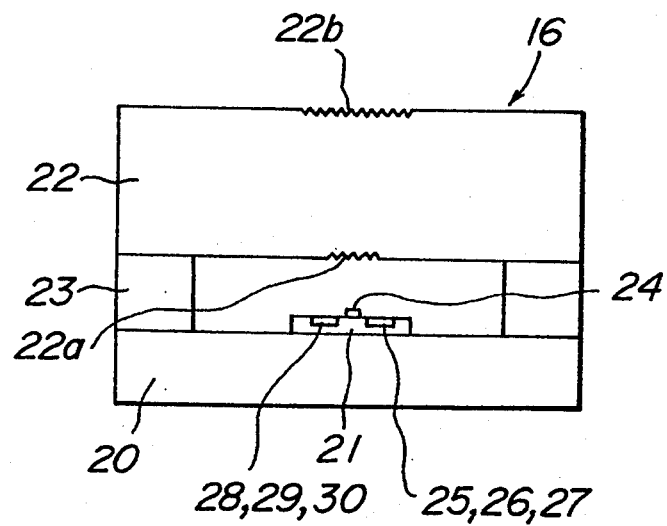
FIG. 5 is a schematic view showing a light emitting and receiving device of FIG. 4.
Figure 6:
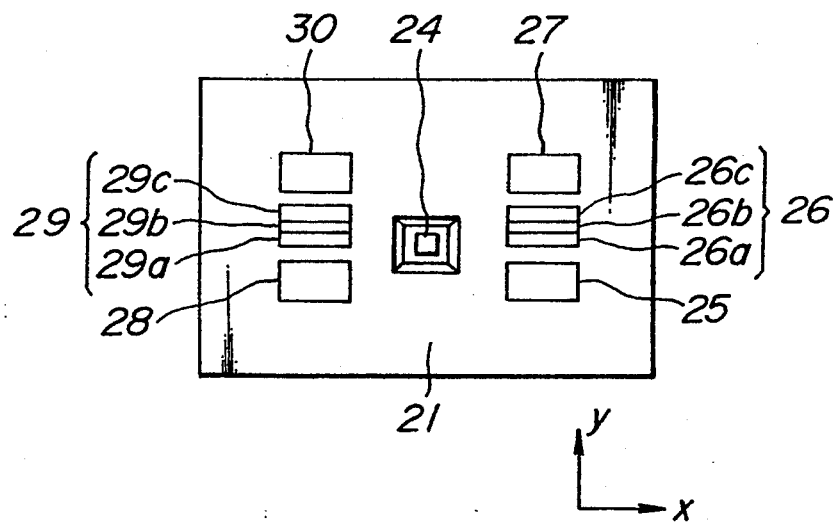
FIG. 6 is a plan view of the light emitting and receiving device of FIG. 5.
Figure 7:
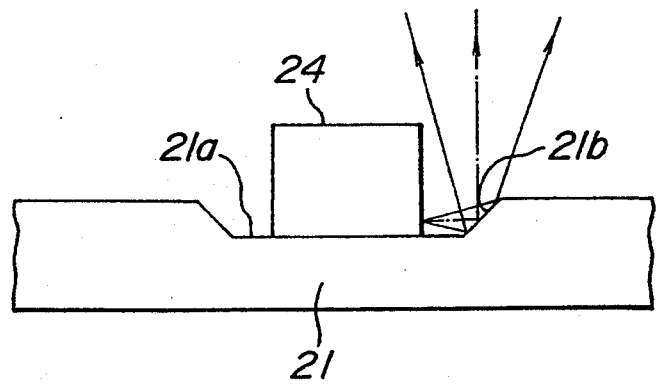
FIG. 7 is a cross section of the device shown in FIG. 6.
Figure 8:
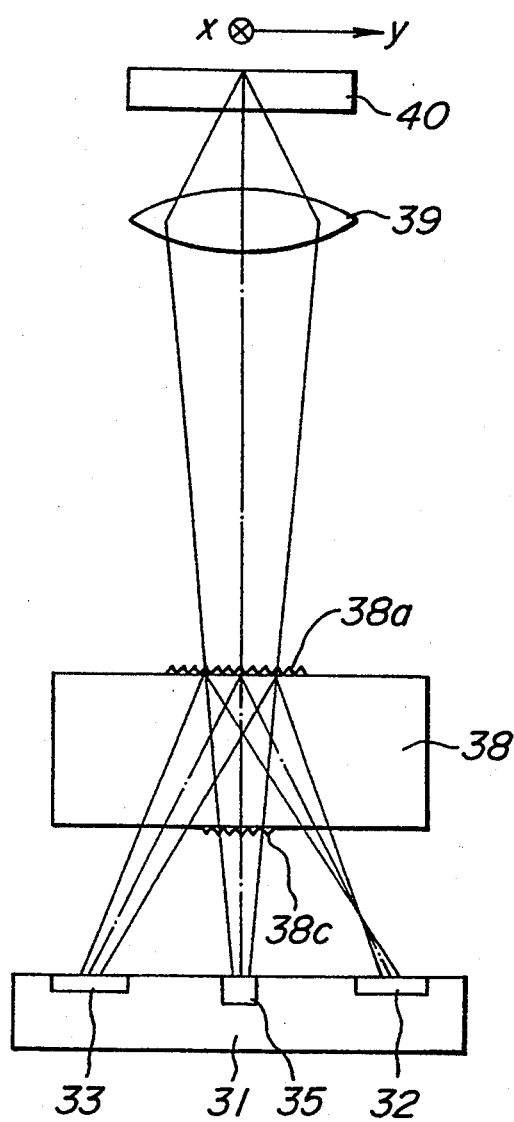
FIG. 8 is a schematic view illustrating another known optical head.

Now the present invention will be explained in detail with reference various embodiments shown in the drawings.

FIG. 13 is a schematic view showing a first embodiment of the optical head according to the invention. The optical pick-up head of the present embodiment uses a single main beam and two sub-beams and comprises a unit 51 including semiconductor laser, photodetectors, holograms and polarization beam splitting plane. Three laser beams emanating from the unit 51 are projected onto a magneto-optical record medium 55 by means of collimator lens 52, beam dividing or separating mirror 53 formed by a plane non-parallel plate and objective lens 54. The three laser beams reflected by the record medium 55 are then made incident upon the unit 51 by means of the objective lens 54, beam separating mirror 53 and collimator lens 52. In the present embodiment, a direction parallel with an information track on the magneto-optical record medium 55 is denoted by y and a tracking direction perpendicular to the track direction y is represented by x.

FIG. 14 is a plan view showing the unit 51 and FIG. 15 is a side view of the unit viewed in a direction A in FIG. 14. The unit 51 comprises semiconductor substrate 56, spacer 58 and beam splitting element 59.

The beam splitting element 59 comprises a plane parallel optical block 60 and plane parallel plates 61a and 61b provided on opposite sides of the block 60. In a surface of the block 60 facing the semiconductor laser 51, there are formed gratings 60a for diving the laser beam emitted by the semiconductor laser 51 into a single main beam (zero order beam) and two sub-beam (±1-order beams). The gratings 60a may be formed by etching or 2P method. In opposite surface of the block 60, there are formed first hologram 60b for diffracting the three beams reflected by the magneto-optical record medium 55 and having a detracting function for giving ±1-order beams opposite focal powers and a second hologram 60c having no lens function. These holograms 60b and 60c may be also formed by etching or 2P method. It should be noted that a diffracting direction of the first hologram 60b is in the direction x and a diffracting direction of the second hologram 60c is inclined by 45 degrees with respect to the directions x and y. At contact surfaces between the optical block 60 and the plane parallel plates 61a and 61b, there are formed polarization beam splitting planes 62a and 62b by coating multiple dielectric films. The beam splitting element 59 is arranged such that the polarization beam splitting planes 62a and 62b are inclined by 45 degrees with respect to the directions x and y on an xy plane.

In a surface of the semiconductor substrate 57, there is formed a recess by etching as shown in FIG. 17 and a semiconductor laser 63 is arranged on a bottom of the recess. A laser beam emitted by the semiconductor laser 63 in a direction parallel with the surface of the semiconductor substrate 57 is reflected upward by means of a mirror 64 (see FIG. 16) formed on an inclined side wall of the recess. Then the laser beam propagates in a direction substantially perpendicular to the surface of the semiconductor substrate 57. In the surface of the semiconductor substrate 57 there are further formed photodetectors 65 and 66 which receive the ±1-order beams emanating from the hologram 60b and photodetectors 67a, 67b and 68a, 68b which receive the ±1-order beams of the main beam which have been diffracted by the hologram 60c and then have been divided by the polarization beam splitting planes 62a and 62b, respectively in accordance with the polarizing directions thereof.

The photodetector 65 comprises three light receiving elements 65a, 65b and 65c corresponding to the +1-oder beams of the main beam and two sub-beams, and the middle light receiving element 65b has three light receiving regions 65d, 65e and 65f which are divided along lines extending in the diffracting direction of the hologram 60b. Similarly, the photodetector 66 comprises three light receiving elements 66a, 66b and 66c for receiving the −1-oder beams of the main beam and two sub-beams, and the middle light receiving element 66b has three light receiving regions 66d, 66e and 66f divided along lines extending in the diffracting direction of the hologram 60b.

The optical path dividing mirror 53 comprises a first surface 53a having multiple dielectric films coated thereon and a second surface 53b serving as a reflection mirror. The three laser beams emitted from the semiconductor laser 53 and divided by the gratings 60a are reflected by the first surface 53a and then are made incident upon the magneto-optical record medium 55 by means of the objective lens 54. Each of the three return laser beams reflected by the magneto-optical record medium 55 is divided into a first return beam which is reflected by the first surface 53a and a second return beam which is transmitted through the first surface 53a, reflected by the second surface 53b and transmitted through the first surface 53a again. In the present embodiment, the first surface 53a is formed such that its transmittances Tp, Ts and reflectances Rp and Rs for the P-polarized component and S-polarized component are as follows:

Tp=100%, Rp=0%, Ts=30% and Rs=70%.

In the optical head of the present embodiment, the laser beam emitted by the semiconductor laser 63 mounted on the semiconductor substrate 57 is first reflected by the mirror 64 in the direction substantially perpendicular to the surface of the semiconductor substrate and is made incident upon the gratings 60a of the optical block 60. Then the single laser beam is divided into the three laser beams, i.e. the main beam (zero order beam) for writing or reading information on or from the magneto-optical record medium 55 and the two sub-beams (±1-order beams) for detecting the tracking error. These three laser beams are then transmitted through the hologram 60b and are made incident upon the mirror 53 by means of the collimator lens 52. Then the three beams are reflected by the first surface 53a of the mirror 53 and are then projected on the magneto-optical record medium 55 by means of the objective lens 54. It should be noted that the incident laser beams upon the beam dividing mirror 53 are S-polarized.

The return laser beams reflected by the magneto-optical record medium 55 are made incident upon the beam dividing mirror 53 by means of the objective lens 54. Each of the three return beams is divided into the first return beam reflected by the first surface 53a and the second return beam transmitted through the first surface 53a, reflected by the second surface 53b and transmitted through the first surface 53a. In this manner, there are obtained three first return beams and three second return beams.

The three first return beams divided by the beam dividing mirror 53 are made incident upon the hologram 60b by means of the collimator lens 52 and are diffracted thereby as shown in FIG. 17 which is a cross sectional view cut along a line B—B in FIG. 14. That is to say, the ±1-order beams of the main beam are made incident upon the light receiving regions 65d, 65e, 65f and 66d, 66e, 66f of the light receiving elements 65b and 66b, respectively, the +1-order beams of the two sub-beams are made incident upon the light receiving elements 65a and 65c, and and the −1-order beams of the two sub-beams are made incident upon the light receiving elements 66a and 66c.

The hologram 60b serves to give the ±1-order beams the mutually opposite focal powers, and thus when the laser beam are just focused on the magneto-optical record medium 55, a size of a beam spot on the light receiving element 65b becomes identical with that of a beam spot on the light receiving element 66b. However, when a focusing condition deviates from the in-focused condition, the sizes of these beam spots on the light receiving elements 65b and 66b change in opposite directions. Therefore, a focusing error signal FES may be derived in accordance with the beam size method in the following manner.

$$FES = (A1 + A5 + A6) - (A2 + A3 + A4)$$

wherein A1, A2 and A3 denote outputs of the light receiving regions 65d, 65e and 65f and A4, A5 and A6 represent outputs of the light receiving regions 66d, 66e and 66f.

A tracking error signal TES may be derived by the three beam method in the following manner.

$$TES = (A7 + A9) - (A8 + A10)$$

wherein A7, A8, A9 and A10 denote outputs of the light receiving elements 65a, 65c, 66a and 66c, respectively.

The second return beam of the main bean divided by the beam dividing mirror 53 is made incident upon the hologram 60c by means of the collimator lens 52. As shown in FIG. 18 which is a cross sectional view cut along a line C—C in FIG. 14, the second return beam of the main beam is divided into ±1-order beams and these ±1-order beams are made incident upon the polarization beam splitting planes 62a and 62b, respectively. S-polarized components are reflected by these planes and are made incident upon the light receiving elements 67a and 68a, and P-polarized components are transmitted through the planes and are made incident upon the light receiving elements 67b and 68b.

The polarizing direction of the second return beam of the main beam impinging upon the hologram 60c is subjected to the Kerr rotation of ±$\theta$k as illustrated in FIG. 19 in accordance with the information recorded on the magneto-optical record medium 55. As explained above, the polarization beam splitting planes 62a and 62b are inclined with respect to the polarizing direction of the return beam substantially by 45 degrees, and therefore the return beams are made incident upon the polarization beam splitting planes 62a and 62b in a polarizing condition shown in FIG. 20. In this manner, the direction of the Kerr rotation ±$\theta$k in accordance with the information on the magneto-optical record medium 55 may be reproduced by a difference (S1-P1, S2-Ps) between the S-components and the P-components separated by the polarization beam splitting planes 62a and 62b. Therefore, an information signal MOS may be derived in the following manner.

$$MOS = (B1 + B2) - (B3 + B4)$$

wherein B1, B2, B3 and B4 represent outputs of the light receiving elements 68a, 67a, 67b and 68b, respectively.

Now the function of the light path dividing mirror 53 will be explained further in detail.

In the present embodiment, the S-polarized laser beam is made incident upon the first surface 53a of the optical path dividing mirror 53, and therefore 70% of the incident laser beam emitted by the semiconductor laser 63 is reflected by the first surface 53a and is made incident upon the magneto-optical record medium 55 by means of the objective lens 54. The return laser beam reflected by the record medium 55 is subjected to the Kerr rotation and is made incident upon the mirror 53. Since the Kerr rotation angle is very small, it may be assumed that the return beam is of the S-polarized beam and is divided into the first and second return beams.

When the return laser beam impinging upon the mirror 53, substantially 70% of the S-polarized component is reflected by the first surface 53a to form the first return beam and the P-polarized component is substantially transmitted through the first surface. The first return beam is then made incident upon the hologram 60b by means of the collimator lens 52 and the focusing error signal and tracking error signal may be detected in the manner explained above. The P-polarized component transmitted through the first surface 53a is reflected by the second surface 53b and is transmitted again the first surface 53a to form the second return beam. This second return beam contains substantially 9% S-polarized component and substantially 100% P-polarized component. The second return beam is then made incident upon the hologram 60c by means of the collimator lens 52 and the information signal may be derived in the above explained manner.

It should be noted that the return beam reflected by the magneto-optical record medium 55 is subjected to the Kerr rotation of ±$\theta$ and is made incident upon the hologram 60c as the S-polarized beam, so that the magneto-optical signal component is contained in the P-polarized component. In the present embodiment, the second return beam for detecting the information signal contains 100% P-polarized component, so that it is possible to attain the information signal having very high C/N.

Figure 21:
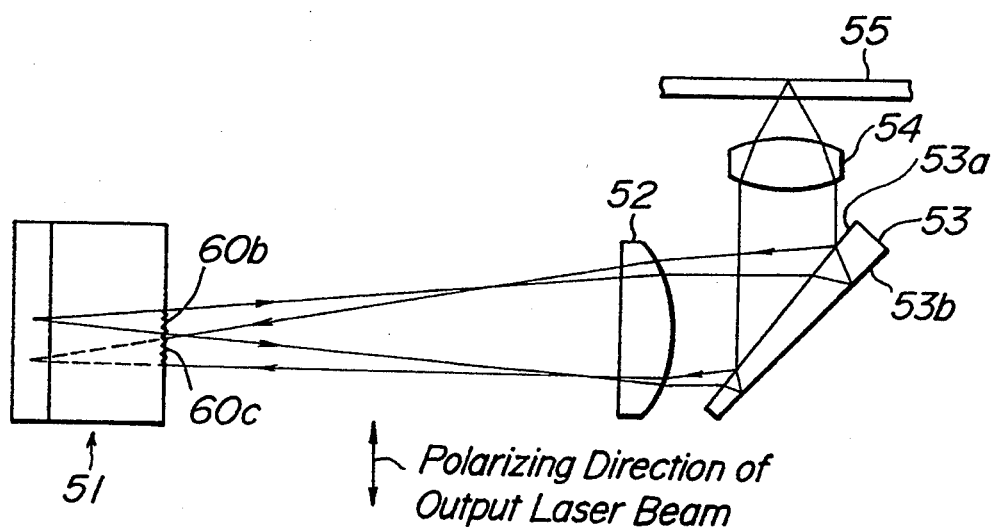
FIG. 21 is a schematic view showing a second embodiment of the optical head according to the invention.

FIG. 21 shows a second embodiment of the optical head according to the invention. In the present embodiment, portions similar to those of the first embodiment are denoted by the same reference numerals used in FIG. 13. This embodiment differs from the first embodiment in the polarizing direction of the laser beam emitted by the semiconductor laser 63 and the construction of the first surface 53a of the optical path dividing mirror 53, but the remaining construction is identical with the first embodiment. That is to say, in the present embodiment, the P-polarized laser beam is made incident upon the optical path dividing mirror 53, and the first surface 53a is formed such that Tp=80%, Rp=20%, Ts=0% and Rs=100%.

When the P-polarized laser beam emitted by the semiconductor laser 63 is made incident upon the optical path dividing mirror 53, it is transmitted through the first surface 53a, reflected by the second surface 53b and is transmitted again through the first surface 53a. After that, the laser beam is made incident upon the magneto-optical record medium 55 by means of the objective lens 54. The return laser beam reflected by the magneto-optical record medium 55 is made incident upon the optical path dividing mirror 53 and is divided into the first and second return beams thereby. The first return beam is transmitted through the first surface 53a, reflected by the second surface 53b and is transmitted again through the first surface 53a, and the second return beam is reflected by the first surface 53a. The first and second return beams are made incident upon the holograms 60b and 60c, respectively like as the first embodiment to derive the focusing error signal, tracking error signal and information signal.

In the present embodiment, the return beam reflected by the magneto-optical record medium 55 and impinging upon the optical path dividing mirror 53 contains the information signal in the S-polarized component. An efficiency of the optical path dividing mirror 53 for the return beam, i.e. a percentage of a beam emanating from the mirror with respect to an incident beam is 64% for the P-polarized component of the first return beam, and is 20% and 100% for the P-polarized component and S-polarized component of the second return beam. Therefore, the second return beam from which the information signal is derived contains 100% S-polarized component including the information signal. Also in the present embodiment, it is possible to obtain the information signal having high C/N. In the present embodiment, the second return beam contains 20% P-polarized component perpendicular to the magneto-optical information component as compared with 9% in the first embodiment, and thus an amplitude of the information signal can be made larger.

Figure 22:
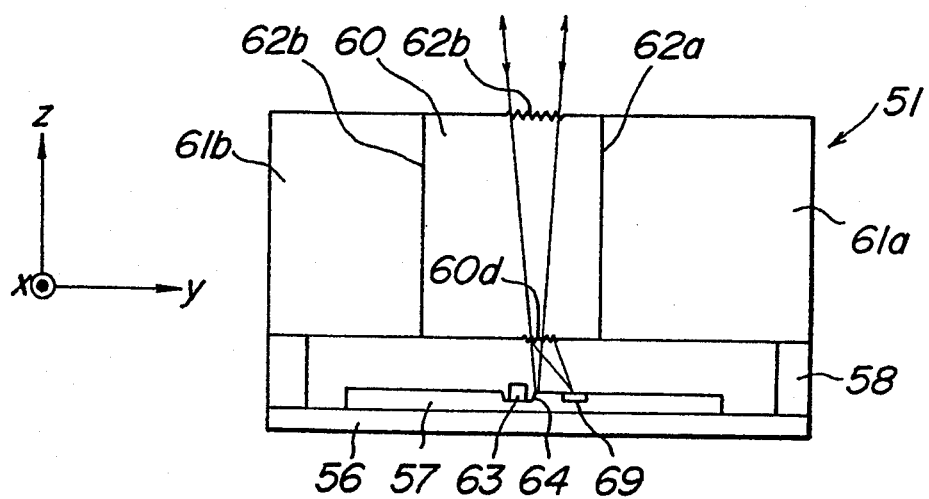
FIG. 22 is a a cross sectional view depicting the optical block of a third embodiment of the optical head according to the invention.
Figure 23:
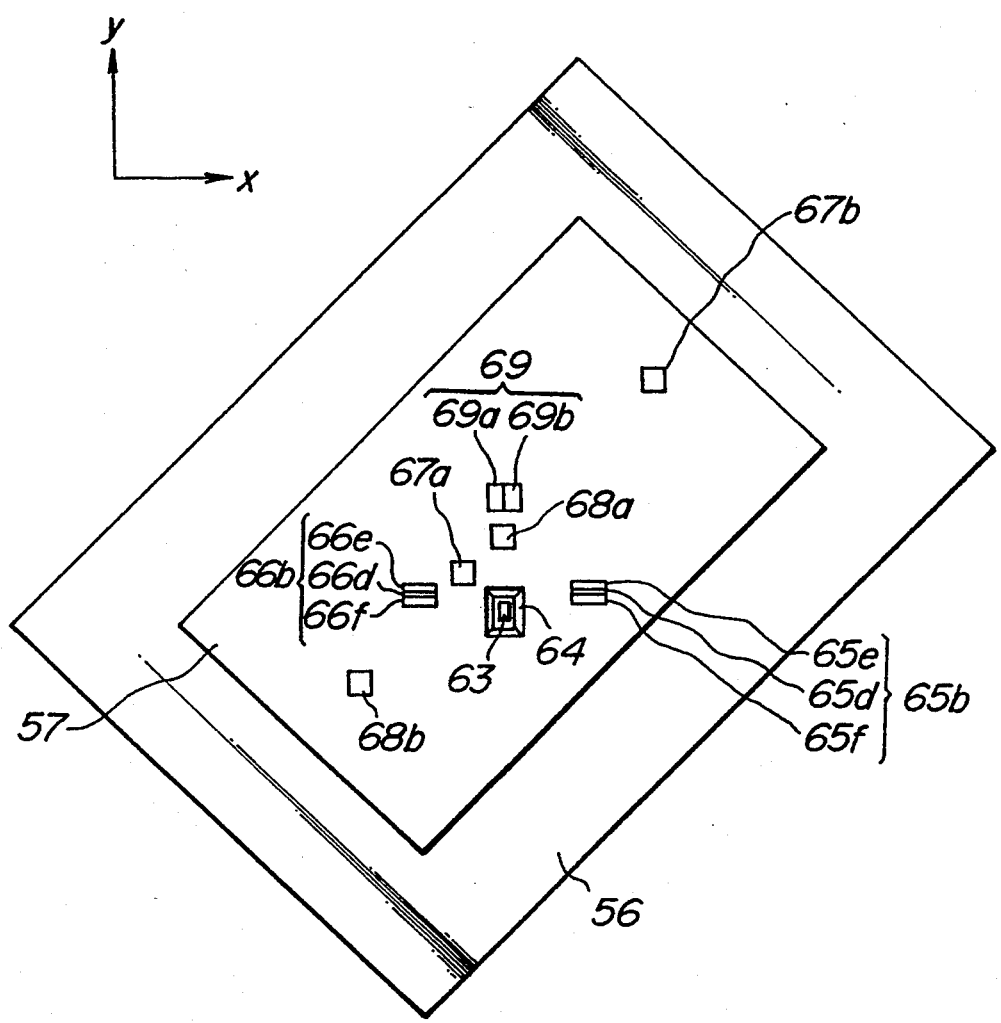
FIG. 23 is a plan view illustrating the light receiving means of FIG. 22.

FIGS. 22 and 23 illustrate major portions of a third embodiment of the optical head according to the invention. In the present embodiment, the tracking error signal is derived by the push-pull method. To this end, on the surface of the optical block 60 facing the semiconductor laser 63 there is formed a hologram 60d instead of the gratings 60a. As shown in FIG. 23, in the surface of the semiconductor substrate 57, there is formed a photodetector 69 having light receiving regions 69a and 69b which receive +1-order beam or −1-order beam of the return beam diffracted by the hologram 60d. In the present embodiment, since the sub-beams are not used, it is no more necessary to form the light receiving elements 65a, 65c, 66a and 66c.

In the present embodiment, the single laser beam is made incident upon the magneto-optical record medium 55 and the return laser beam reflected by the magneto-optical record medium 55 is diffracted by the hologram 60d after being transmitted through the hologram 60b and the +1-order beam or −1-order beam is made incident upon the photodetector 69. Then, the tracking error signal TES may be derived in the following manner by the push-pull method.

$$TES = C1 - C2$$

wherein C1 and C2 denote outputs of the light receiving regions 69a and 69b of the photodetector 69. It should be noted that the focusing error signal and information signal may be obtained in the same manner as that of the first and second embodiments.

In the embodiments so far explained, the ±1-order return beams emanating from the hologram 60c are respectively separated by the polarization beam splitting planes 62a and 62b. However, according to the invention, it is also possible to separate only one of the ±1-order return beams emanating from the hologram 60c in accordance with the polarizing direction. In this case, it is sufficient to provide only one polarization beam splitting plane.

As explained above, according to the invention the semiconductor substrate having the semiconductor laser and photodetecting means and the light splitting means including the hologram and polarization beam splitting plane are integrally formed as a single unit, and therefore the optical head can be small and compact and can have a high reliability. Furthermore, the efficiency of utilizing the return beam from the magneto-optical record medium can be increased, and thus the decrease in C/N can be effectively suppressed and the information signal can be stably read out of the magneto-optical record medium.

FIGS. 24 to 30 show a fourth embodiment of the optical head according to the invention. The optical pick-up head of the present embodiment comprises a unit 71 including semiconductor laser, photodetectors, holograms and polarization beam splitting plane. A linearly polarized laser beam emanating from the unit 71 is projected onto a magneto-optical record medium 73 by means of an objective lens 72. The laser beam reflected by the record medium 73 is then made incident upon the unit 71 by means of the objective lens 72. In the present embodiment, a direction parallel with an information track on the magneto-optical record medium 73 is denoted by y and a tracking direction perpendicular to the track direction y is represented by x. A direction of the polarization of the linearly polarized laser beam emanating from the unit 71 is in parallel with the direction x.

Figure 25:
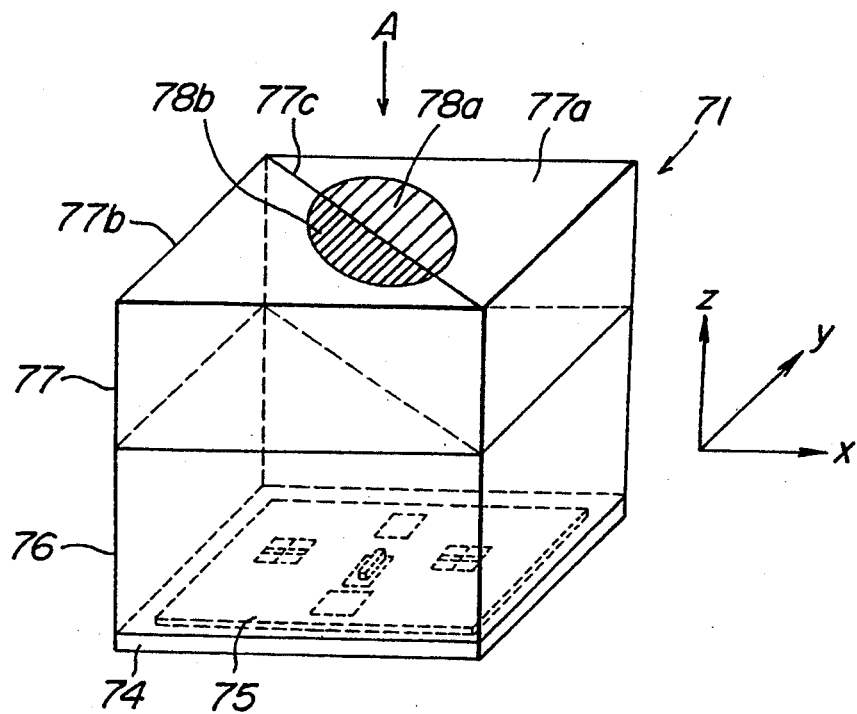
FIG. 25 is a perspective view showing the optical block shown in FIG. 24.
Figure 26:
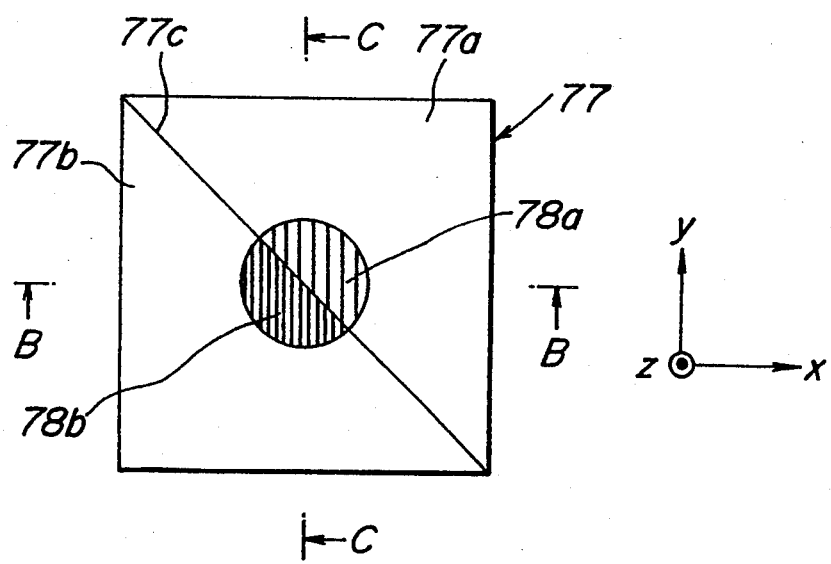
FIG. 26 is a plan view of the optical block.

FIG. 25 is a perspective view showing the unit 71. The unit 71 comprises base plate 74, semiconductor substrate 75, spacer 76 and optical block 77. The optical block 77 comprises two triangular blocks 77a and 77b which are cemented by a polarization beam splitting plane 77c formed by multiple films of dielectric materials. In a surface of the block 77 facing the objective lens 72, there are formed holograms 78a and 78b by etching or 2P method. These holograms 78a and 78b diffract the return laser beam reflected by the magneto-optical record medium 73 such that the pupil is divided thereby on the polarization beam splitting plane 77c as illustrated in FIG. 26 which is a plan view viewed from a direction shown by an arrow A in FIG. 25. The holograms 78a and 78b further function give ±1-order beams opposite focal powers. It should be noted that the polarizing beam splitting plane 77c is arranged such that it is substantially parallel with optical axes of zero order beams emanating from the holograms 78a and 78b and is inclined by substantially 45 degrees with respect to the polarizing direction x of the beam emanating form the unit 71. The hologram 78b has a larger diffraction angle than the hologram 78a.

In a surface of the semiconductor substrate 75, there is formed a recess by etching as shown in FIG. 27 and a semiconductor laser 81 is mounted on a bottom of the recess. A laser beam emitted by the semiconductor laser 81 in a direction parallel with the surface of the semiconductor substrate 75 is reflected upward by means of a mirror 82 formed on an inclined side wall of the recess. In this manner, the laser beam propagates in a direction substantially perpendicular to the surface of the semiconductor substrate 75. In the surface of the semiconductor substrate 75 there are further formed photodetectors 83, 84, 85 and 86 which receive the ±1-order beams emanating from the holograms 78a and 78b. The photodetectors 83 and 84 comprise light receiving regions 83a, 83b, 83c, 83d, 83e and 83f and 84a, 84b, 84c, 84d, 84e and 84f, respectively.

Now the operation of the optical head of the present embodiment will be explained also with reference to FIGS. 28 and 29 which show cross sectional views cut along a line B—B in FIG. 26 and FIG. 30 which depicts a cross sectional view cut along a line C—C in FIG. 26.

In this embodiment, the linearly polarized laser beam emitted by the semiconductor laser 81 mounted on the semiconductor substrate 75 is first reflected by the mirror 82 in the direction substantially perpendicular to the surface of the semiconductor substrate and is transmitted through the holograms 78a and 78b. Then the laser beam is focused onto the magneto-optical record medium 73 by means of the objective lens 72. The return laser beam reflected by the magneto-optical record medium 73 is made incident upon the holograms 78a and 78b by means of the objective lens 72.

The return beam impinging upon the hologram 78a is diffracted thereby and +1-order beam is made incident upon the light receiving regions 83d, 83e and 83f as illustrated in FIGS. 27, 28 and 30. −1-order beam emanating from the hologram 78a is made incident upon the polarization beam splitting plane 77c. A return beam transmitted through the plane 77c is made incident upon the light receiving regions 84d, 84e and 84f and a return beam reflected by the plane 77c is made incident upon the photodetector 85. The return beam impinging upon the hologram 78b is diffracted thereby and the −1-order beam is made incident upon the light receiving regions 84a, 84b and 84c and and the +1-order beam is made incident upon the polarization beam splitting plane 77c. A laser beam transmitted through the plane 77c is made incident upon the light receiving regions 83a, 83b and 83c and a laser beam reflected by the plane 77c is made incident upon the photodetector 86.

The hologram 78b has the diffraction angle larger than the hologram 78a, so that positions of spots of the diffracted beams emanating from the holograms 78a and 78b on the photodetectors 83 and 84 such that the spot position of the diffracted beam emanating from the hologram 78b is separated from the semiconductor laser 81 by a distance which is longer than a distance by which the spot position of the diffracted beam emanating from the hologram 78a is separated from the semiconductor laser 81. The holograms 78a and 78b are formed such that they give the +1-order and −1-order diffracted beams opposite focal powers, and thus a size of the beam spot on the light receiving regions 83a, 83b, 83c, 83d, 83e and 83f becomes identical with a size of the beam spot on the light receiving regions 84a, 84b, 84c, 84d, 84e and 84f, but these sizes are changed in opposite directions in accordance with deviations from the in-focus condition. Therefore, the focusing error signal FES may be derived by the beam size method in the following manner.

$$FES = (A1 + A4 + A8 + A9 + A11 + A12) - (A2 + A3 + A5 + A6 + A7 + A10)$$

wherein A1, A2, A3, A4, A5, A6 and A7, A8, A9, A10, A11, A12 denote outputs of the light receiving regions 83a, 83b, 83c, 83d, 83e, 83f and 84a, 84b, 84c, 84d, 84e, 84f, respectively.

Figure 24:
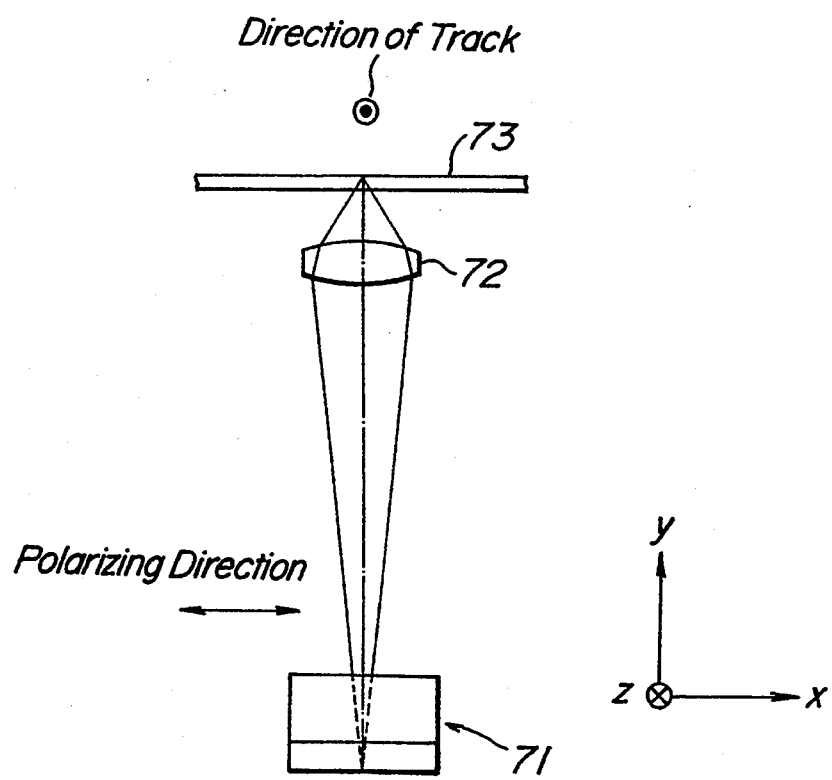
FIG. 24 is a schematic view depicting a fourth embodiment of the optical head according to the invention.

In FIG. 24, the track direction is perpendicular to the plane of the drawing of FIG. 24, and therefore a distribution of an amount of light in the direction x changes in asymmetrical manner. Then, the tracking error signal TES may be obtained by the push-pull method by deriving a difference between intensities of the diffracted beams emanating from the holograms 78a and 78b in the following manner.

$$TES = P1 - P2$$

$$TES = (A4 + A5 + A6) - (A7 + A8 + A9)$$

wherein P1 and P2 denote outputs of the photodetectors 85 and 86, respectively.

The laser beam emitted by the semiconductor laser 81 is linearly polarized in the direction parallel with the direction x and the the polarization beam splitting plane 77c is inclined with respect to the polarizing direction of the laser beam substantially by 45 degrees. Therefore, the −1-order diffracted beam emanating from the hologram 78a is transmitted through the polarization beam splitting plane 77c and the +1-order diffracted beam emanating from the hologram 78b is reflected by the polarization beam splitting plane 77c. In this manner, the ±1-order beams are separated from each other by means of the polarization beam splitting plane 77c. Therefore, an information signal MOS may be obtained by deriving a difference between the intensities of these two beams separated by the polarization beam splitting plane 77c in the following manner.

$$MOS = (A1 + A2 + A3 + A10 + A11 + A12) - (P1 + P2)$$

The above mentioned fourth embodiment may be modified in various ways. For instance, the focusing error signal FES may be derived in the following manner.

$$FES = (A4 + A8 + A9) + G(A1 + A11 + A12) - (A5 + A6 + A7) + G(A2 + A3 + A10)$$

wherein G represents a coefficient which is determined such that under the in-focused condition, (A4+A8+A9) and (A5+A6+A7) become identical with (A1+A11+A12) and (A2+A3+A10), respectively. In such a modification, a difference in an amount of the laser beam transmitted through the polarization beam splitting plane 77c and being made incident upon the light receiving regions 83a, 83b, 83c, 84d, 84e and 84f and the laser beam being made incident upon the light receiving regions 83d, 83e, 83f, 84a, 84b and 84c without being transmitted through the polarization beam splitting plane 77c may be adjusted, and thus the focusing error signal FES may be obtained much more stably.

Further, in the above fourth embodiment, the optical system is designed as the definit optical system, but it may be designed as indefinite optical system by arranging a collimator lens between, for instance the unit 71 and the objective lens 72.

As explained above, in the present embodiment, the semiconductor substrate having the semiconductor laser and a plurality of photodetectors arranged thereon is formed as an integral body together with the optical block having the holograms and polarization beam splitting planes formed thereon, and therefore the optical head can be small in size and compact, and the information signal can be read out of the magneto-optical record medium in a reliable and stable manner.

FIGS. 31 to 33 show a fifth embodiment of the optical head according to the invention. The optical pick-up head of the present embodiment comprises a semiconductor substrate 101 such as a silicon substrate on whose surface a semiconductor laser 102 is mounted and in whose surface there are formed first, second, third and fourth photodetectors 103, 104, 105 and 106. A laser beam emitted by the semiconductor laser 102 in a direction parallel with the surface of the semiconductor substrate 101 is reflected by a mirror 107 formed in the surface of the semiconductor substrate 101 in a direction substantially perpendicular to the surface of the semiconductor substrate. Then, the laser beam is made incident upon a magneto-optical record medium 110 by means of beam splitting element 108 in the form of a block and objective lens 109. In the present embodiment, a direction parallel with an information track on the magneto-optical record medium 110 is denoted by y and a tracking direction perpendicular to the track direction y is represented by x.

A return laser beam reflected by the magneto-optical record medium 110 is received by the first to fourth photodetectors 103 to 106 by means of the objective lens 109 and beam splitting element 108.

The beam splitting element 108 comprises a hologram element 108a in the form of a plane parallel optical block and plane parallel plates 108b and 108c provided on opposite sides of the hologram element 108a. In a surface of the hologram element 108a facing the semiconductor laser 102, there are formed gratings 108d for diving the laser beam emitted by the semiconductor laser 102 into a single main beam (zero order beam) and two sub-beam (±1-order beams). The gratings 108d may be formed by etching or 2P method. In an opposite surface of the hologram element 108a, there is formed a hologram 108e having a lens function for giving ±1-order beams opposite focal powers. The hologram 108e may be also formed by etching or 2P method. A direction of gratings of the hologram 108e is set to be parallel with the information track direction y. Contact surfaces between the hologram element 108a and the plane parallel plates 108b and 108c are set to be substantially parallel with an optical axis of a zero order beam emanating from the hologram 108e. At these contact surfaces, there are formed polarization beam splitting planes 108f and 108g by applying multiple dielectric films. The beam splitting element 108 is arranged such that a normal line of the polarization beam splitting planes 108f and 108g is inclined with respect to the directions x and y on the xy plane by substantially 45 degrees.

The laser beam emitted by the semiconductor laser 102 is reflected upward by means of the mirror 107 on an inclined side wall of a recess formed in the surface of the semiconductor substrate 101. Then the laser beam propagates in a direction substantially perpendicular to the surface of the semiconductor substrate 107. The laser beam is divided into a single main beam (zero order beam) and two sub-beams (±1-order beams) by means of the gratings 108d. The three beams are transmitted through the hologram 108e as the zero order beam and are then made incident upon the magneto-optical record medium 110 by means of the objective lens 109. Spots of the three beams on the record medium 110 are aligned along a line which is slightly inclined with respect the information track on the record medium. The laser beam emitted by the semiconductor laser 102 is linearly polarized in the direction x and the return beam reflected by the magneto-optical record medium 110 is subjected to the Kerr rotation in accordance with a direction of magnetization recorded in the magneto-optical record medium 110, so that a polarizing direction of the return beam deviates from the direction x by ±Kerr rotation angle.

The return laser beams reflected by the magneto-optical record medium 110 are made incident upon the hologram element 108a of the beam dividing element 108. Each of the three return beams is divided into +1-order diffracted beam and −1-order diffracted beam by means of the hologram 108e. The +1-order beam of the main beam is made incident upon polarization beam splitting plane 108f and P-component which is transmitted through the plane 108f is received by the first photodetector 103 and S-component reflected by the polarization beam splitting plane 108f is received by the fourth photodetector 106. Similarly the −1-order beam of the main beam is made incident upon the polarization beam splitting plane 108g and P-component transmitted through the plane 108g is made incident upon the second photodetector 104 and S-component reflected by the plane 108g is received by the third photodetector 105.

The +1-order beams of the two sub-beams are transmitted through the polarization beam splitting plane 108f and are received by the first photodetector 103 and the −1-order beams of the two sub-beams are transmitted through the polarization beam splitting plane 108g and are made incident upon the second photodetector 204.

The first photodetector 103 comprises three light receiving elements 103a, 103b and 103c which receive the +1-order beams of the three beams and the middle light receiving element 103b receiving the +1-order diffracted beam of the main beam comprises three light receiving regions 103d, 103e and 103f which are divided along lines extending in the diffracting direction of the hologram 108e. Similarly the second photodetector 104 comprises three light receiving elements 104a, 104b and 104c which receive the −1-order beams of the three beams and the middle light receiving element 104b receiving the −1-order diffracted beam of the main beam comprises three light receiving regions 104d, 104e and 104f which are divided along lines extending in the diffracting direction of the hologram 108e. The fourth and third photodetectors 106 and 105 are formed by single light receiving elements, respectively and receive the S-polarized components of the ±1-order beams of the main beam emanating from the polarization beam splitting planes 108f and 108g.

Now it is assumed that outputs of the light receiving regions 103d, 103e and 103f of the light receiving element 103b of the first photodetector 103 are denoted by Id1, Ie1 and If1, respectively, outputs of the light receiving regions 104d, 104e and 104f of the light receiving element 104b of the second photodetector 104 by Id2, Ie2 and If2, respectively, output of the light receiving elements 103a and 103c of the first photodetector 103 by Ia1 and Ic1, respectively, output of the light receiving elements 104a and 104c of the second photodetector 104 by Ia2 and Ic2, respectively, an output of the third photodetector 105 by I5, and an output of the fourth photodetector 106 is represented by I6. Then, the information signal read out of the magneto-optical record medium 110 may be derived in the following manner.

$$S=(Id1+Ie1+If1+Id2+Ie2+If2)-(I5+I6)$$

The +1-order diffracted beam emanating from the hologram 108e is focused at a point before the first photodetector 103 and the −1-order diffracted beam emanating from the hologram 108e is focused at a point after the second photodetector 104 due to the lens function of the hologram 108e. Therefore, when the laser beams are just focused on the magneto-optical record medium 110, a size of a beam spot of the +1-order beam on the first photodetector 103 becomes identical with that of a beam spot of the −1-order beam on the second photodetector 104. However, when a focusing condition deviates from the in-focused condition, the sizes of these beam spots on the first and second photodetectors 103 and 104 are changed in opposite directions. Therefore, a focusing error signal FES may be derived in accordance with the beam size method in the following manner.

$$FES=(Id1+Ie2+If2)-(Id2+Ie1+If1)$$

A tracking error signal TES may be derived by the three beam method in the following manner.

$$TES=(Ia1-Ic1)+(Ia2-Ic2)$$

FIGS. 34 and 35 illustrate a sixth embodiment of the optical head according to the invention. In the present embodiment, a direction of gratings of the hologram 108e is substantially parallel with the polarization beam splitting planes 108f and 108g and the arrangement of the first to fourth photodetectors 103 to 106 is changed accordingly. The remaining construction of the present embodiment is identical with that of the fifth embodiment just explained above. Also in the present embodiment, the information signal, focusing error signal and tracking error signal can be derived in the same manner as the fifth embodiment.

Figure 36:
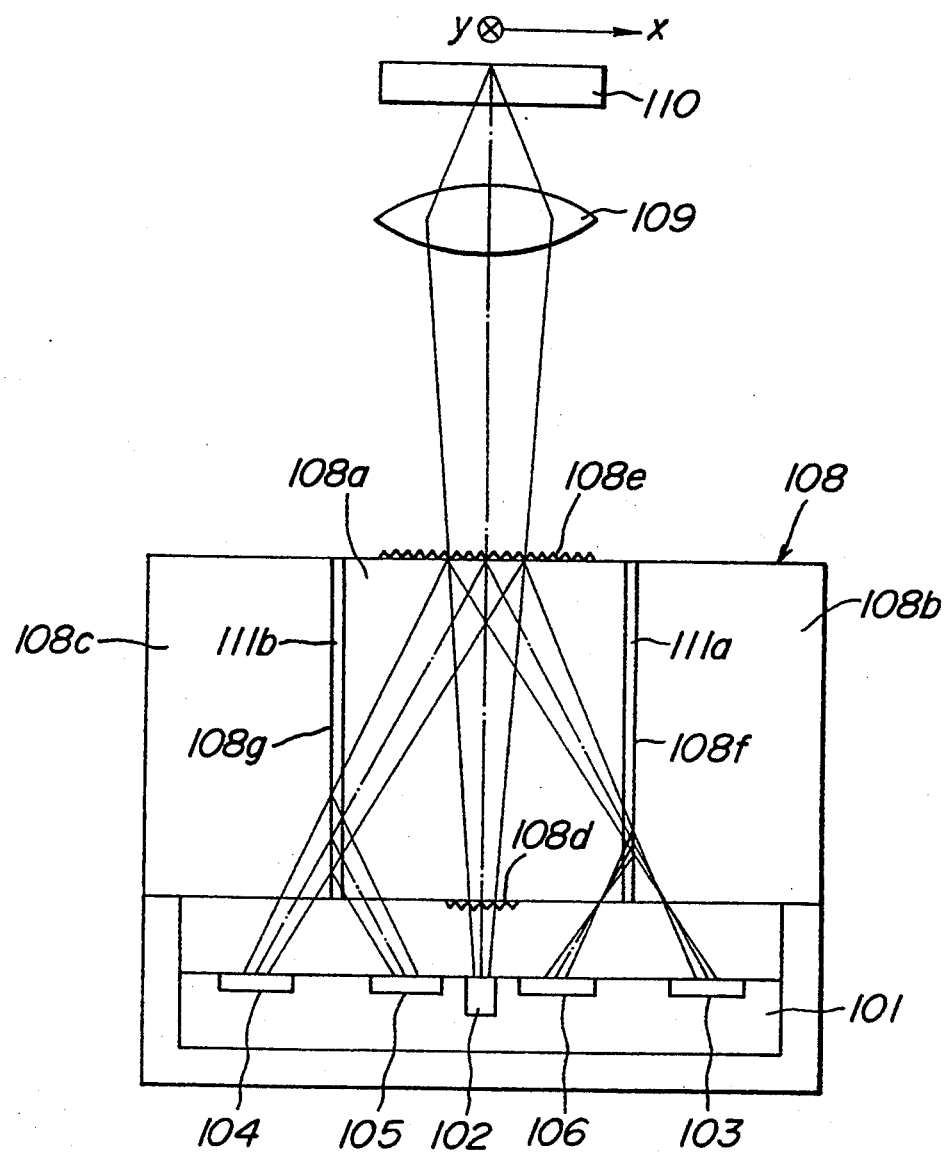
FIG. 36 is a schematic cross sectional view illustrating a seventh embodiment of the optical head according to the invention.
Figure 37:
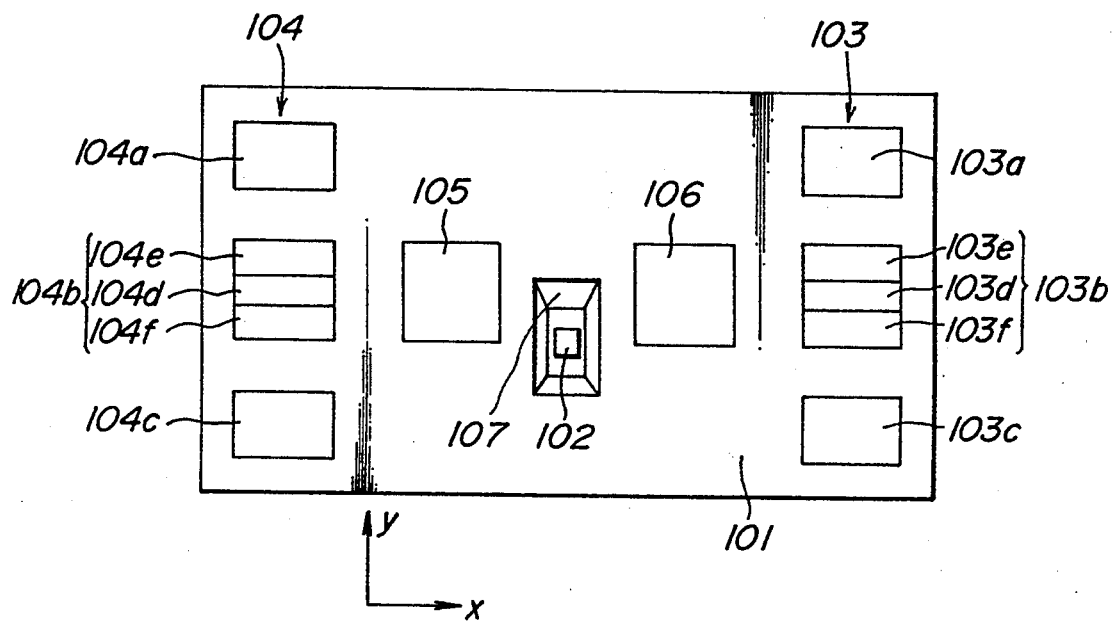
FIG. 37 is a plan view showing a light receiving means shown in FIG. 36.

FIGS. 36 and 37 depict a seventh embodiment of the optical head according to the invention. In the present embodiment, between the hologram element 108a and the polarization beam splitting planes 108g and 108g, there are provided half wavelength plates 111a and 111b, respectively. The half wavelength plates 111a and 111b serve to rotate the polarizing directions of the ±1-order beams diffracted by the hologram 108e by 45 degrees. In the present embodiment, the arrangement of the first to fourth photodetectors 103 to 106 is changed accordingly.

In the present embodiment, normal lines to the polarization beam splitting planes 108g and 108g can be set to be parallel with the tracking direction x, and the information signal, tracking error signal and focusing error signal can be derived in the same manner as that of the fifth embodiment.

In the fifth to seventh embodiments of the optical head according to the invention, the tracking error is detected by the three beam method, but according to the invention the tracking error may be detected by the push-pull method.

Figure 38:
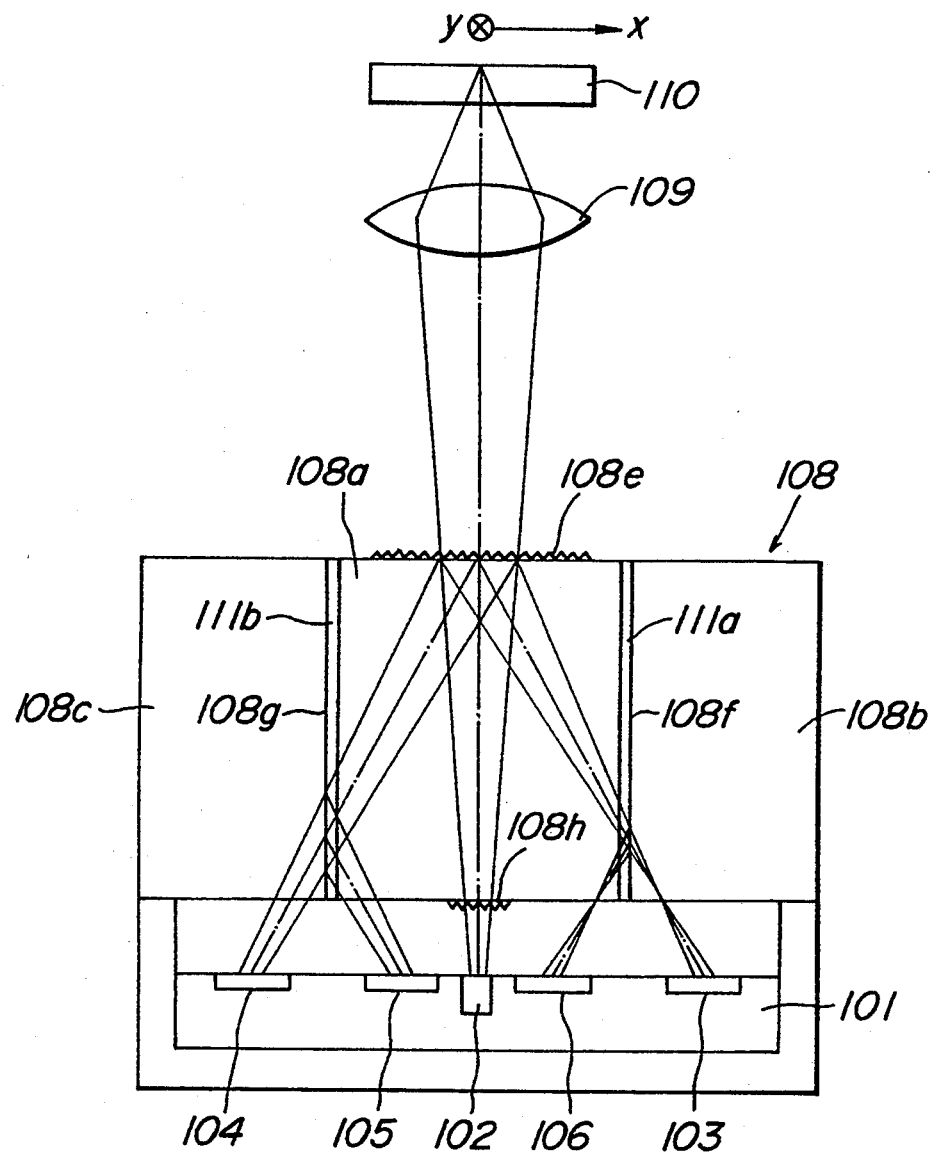
FIG. 38 is a schematic cross sectional view showing a eighth embodiment of the optical head according to the invention.
Figure 39:
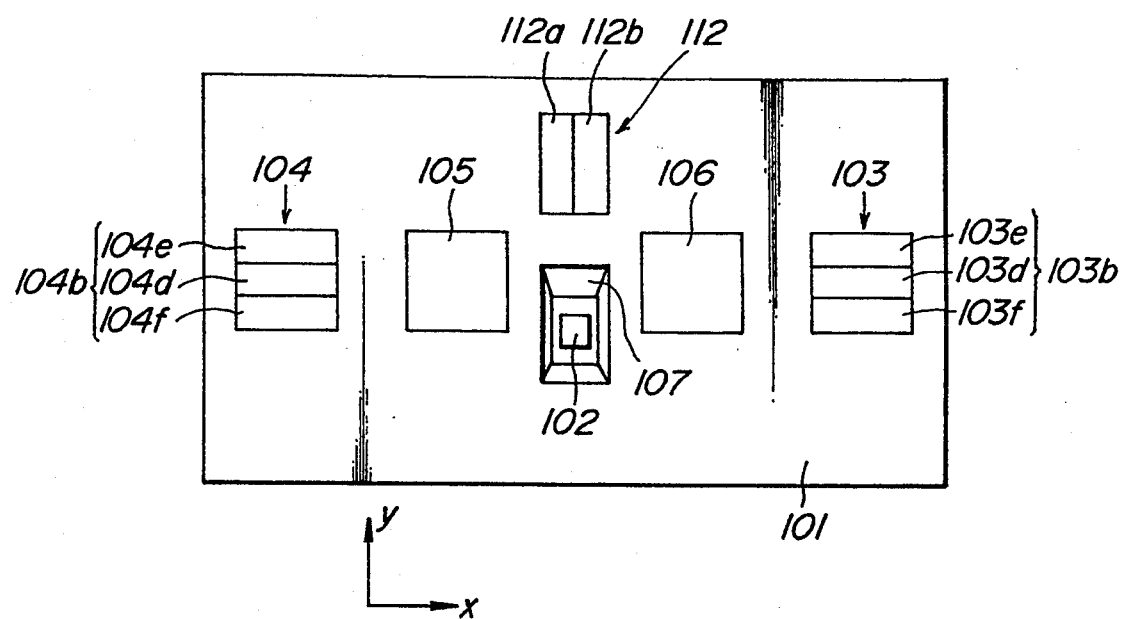
FIG. 39 is a plan view depicting a light receiving means shown in FIG. 38.

FIGS. 38 and 39 show a eighth embodiment of the optical head according to the invention, in which the tracking error signal is derived by the push-pull method. In the present embodiment, in the lower surface of the hologram element 108a facing the semiconductor laser 102 there is formed a hologram 108h instead of the gratings 108d in the previous embodiments. Then, the laser beam emitted by the semiconductor laser 102 is reflected by the mirror 107 and then the zero order beam transmitted through the holograms 108h and 108e is made incident upon the magneto-optical record medium 110 by means of the objective lens 109.

The return beam reflected by the magneto-optical record medium 110 is made incident upon the hologram element 108a by means of the objective lens 109 and is separated thereby into a zero order beam and ±1-order beams diffracted in the direction x. The ±1-order beams emanating from the hologram 108e are made incident upon the polarization beam splitting planes 108f and 108g by means of the half wavelength plates 111a and 111b, respectively. P-polarized component of the +1-order diffracted beam transmitted through the polarization beam splitting plane 108f is received by the first photodetector 103 and S-polarized component of the +1-order beam reflected by the polarization beam splitting plane 108f is received by the fourth photodetector 106. P-polarized component of the −1-order diffracted beam transmitted through the polarization beam splitting plane 108g is received by the second photodetector 104 and S-polarized component of the −1-order beam reflected by the polarization beam splitting plane 108g is received by the third photodetector 105. The zero order beam emanating from the hologram 108e is diffracted by the hologram 108h and +1-order or −1-order diffracted beam emanating from the hologram 108h is received by the fifth photodetector 112.

The first and second photodetectors 103 and 104 comprise the light receiving elements 103b and 104b, respectively which have three light receiving regions 103d, 103e, 103f and 104d, 104e, 104f, respectively which are divided along lines extending in parallel with the diffracting direction of the hologram 108e, while the third and fourth photodetectors 105 and 106 comprise single light receiving elements. The fifth photodetector 112 comprises two light receiving regions 112a and 112b which are divided in a direction parallel with the diffracting direction of the hologram 108h.

In the present embodiment, the information signal and focusing error signal can be derived in the same manner as that of the fifth to seventh embodiments, and the tracking error signal TES can be derived by the push-pull method in the following manner.

$$TES=P112a-P1132b$$

wherein P112a and P112b represent outputs of the light receiving regions 112a and 112b of the fifth photodetector 112.

Figure 40:
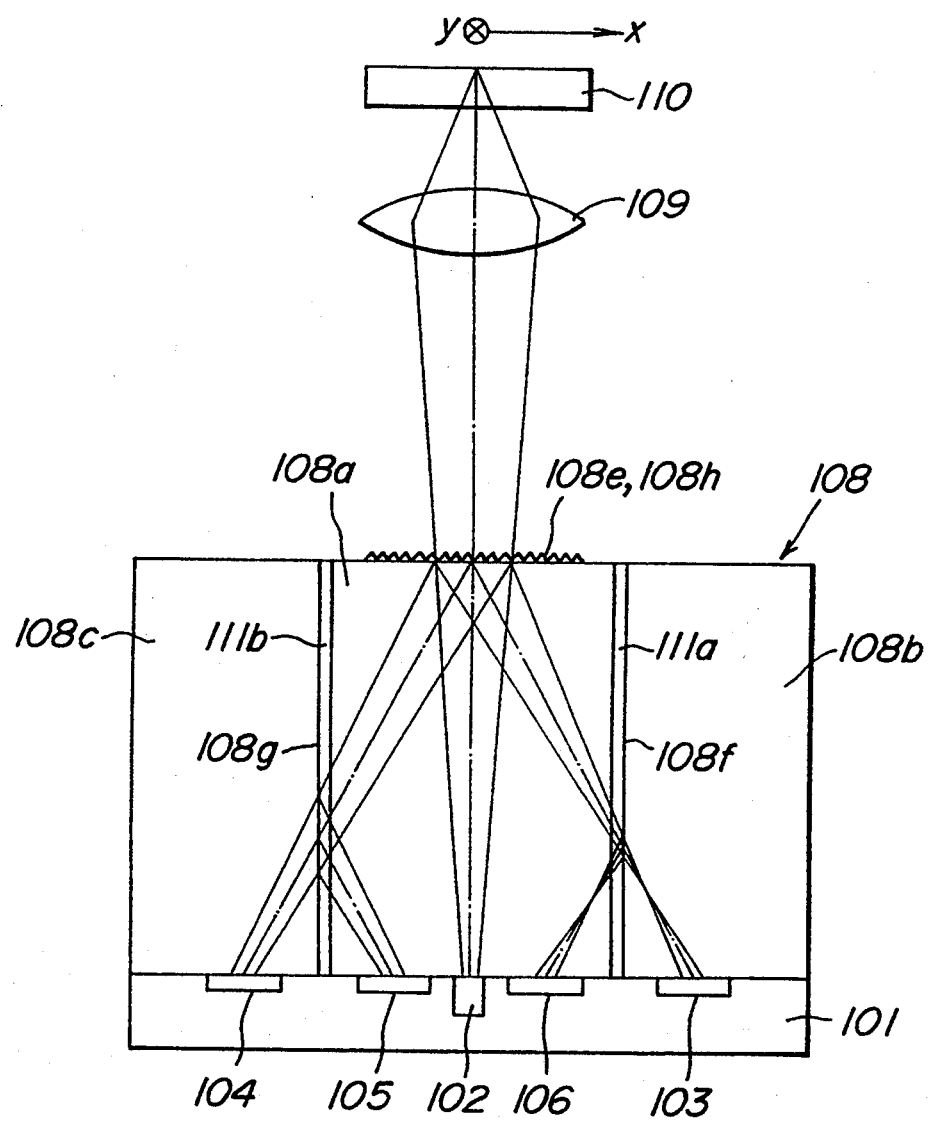
FIG. 40 is a schematic cross sectional view illustrating a ninth embodiment of the optical head according to the invention.
Figure 41:
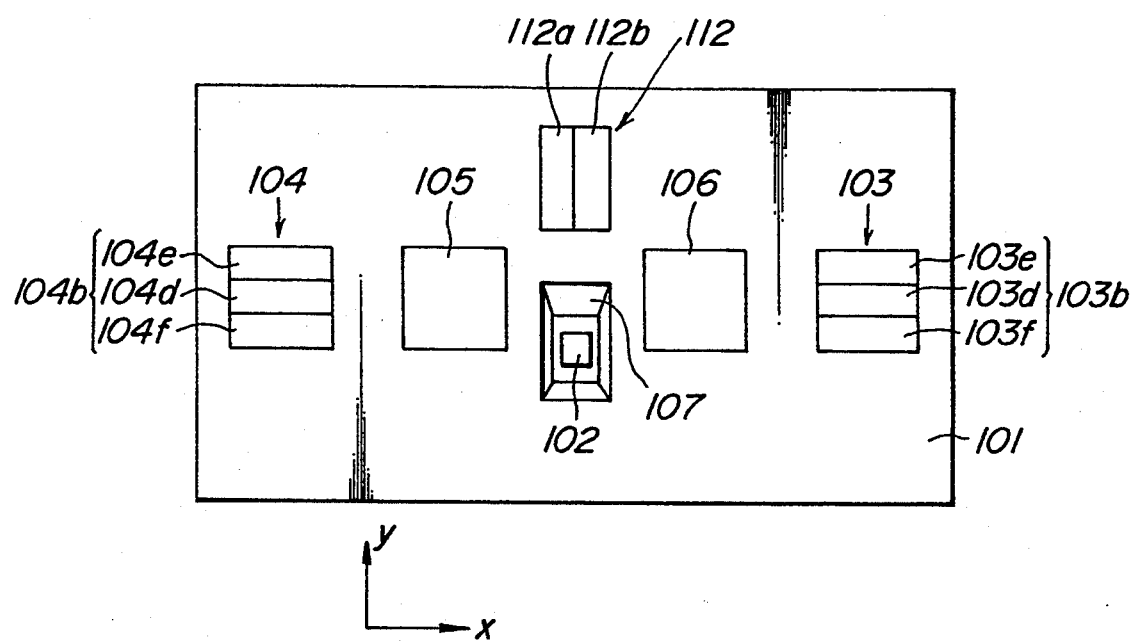
FIG. 41 is a plan view of a light receiving means in FIG. 40.

FIGS. 40 and 41 show a ninth embodiment of the optical head according to the invention. In the eighth embodiment, the hologram 108h is formed on the surface of the optical block of the hologram element 108a, but in the present embodiment the hologram 108h is formed on the opposite surface of the optical block in a superimposed manner with the hologram 108e. The remaining construction of the present embodiment is identical with the eighth embodiment.

Also in the present embodiment, the information signal, focusing error signal and tracking error signal can be obtained in the same manner as the eighth embodiment. In the present embodiment, the hologram 108h is formed on the surface of the hologram element 108a facing the objective lens 109, so that the beam splitting element 108 can be intimately contacted with the semiconductor substrate 101.

Figure 42:
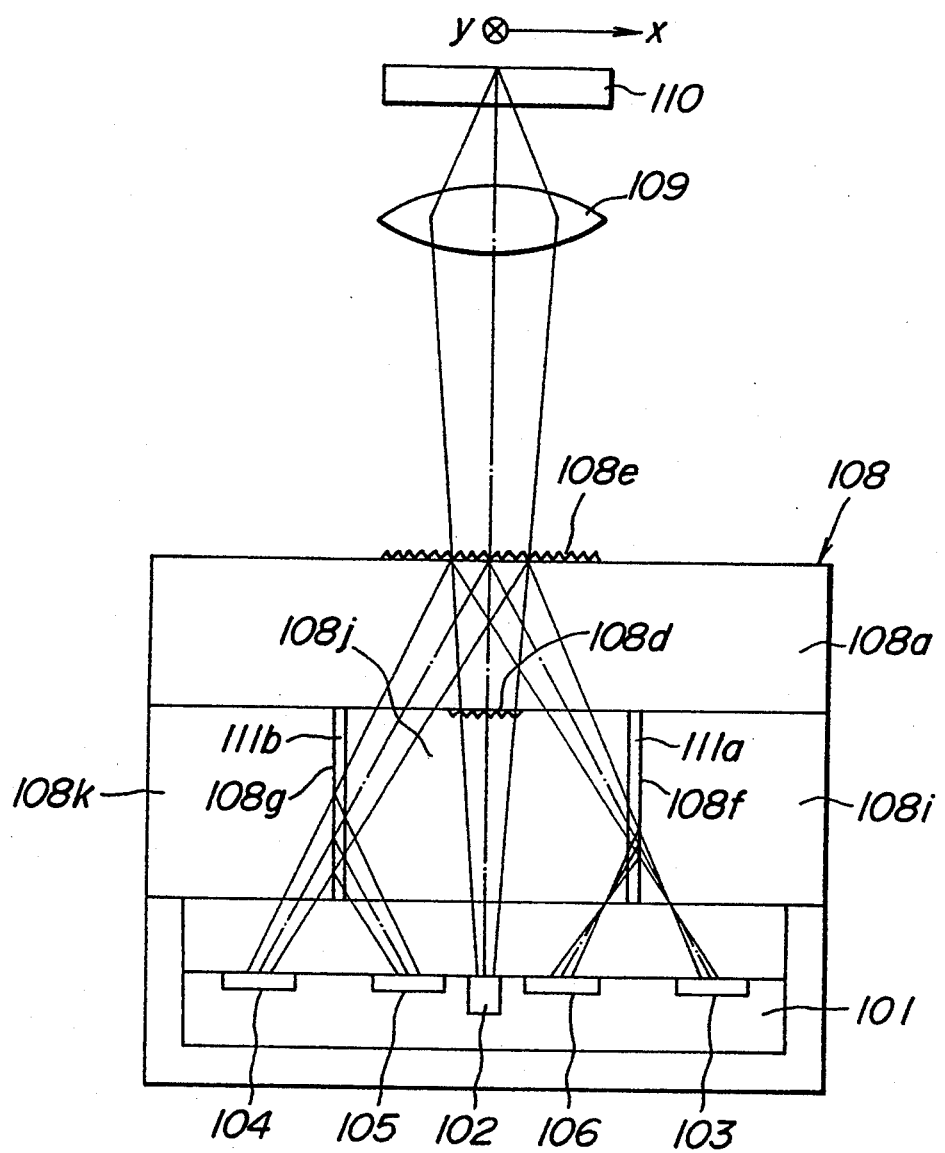
FIG. 42 is a schematic cross sectional view representing a tenth embodiment of the optical head according to the invention.
Figure 43:
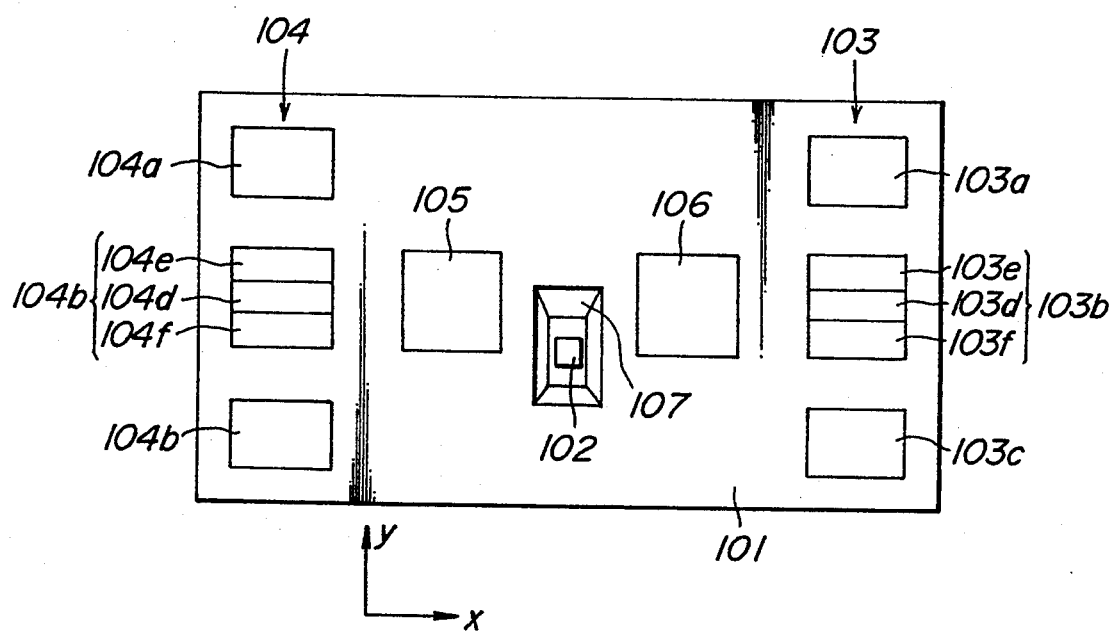
FIG. 43 is a plan view showing an embodiment of the light emitting and receiving device according to the invention.

FIGS. 42 and 43 illustrate a tenth embodiment of the optical head according to the invention. In the present embodiment, between the semiconductor substrate 101 and the hologram element 108a, there are arranged three plane parallel plates 108i, 108j and 108k which are aligned in the direction x. Between the plane parallel plates 108i and 108j and between the plane parallel plates 108j and 108k, there are provided polarization beam splitting planes 108f and 108g, respectively by applying multiple dielectric films. The remaining construction of the present embodiment is same as the seventh embodiment, and the information signal, focusing error signal and tracking error signal can be derived in the same manner as that of the seventh embodiment.

In the fifth to tenth embodiments of the optical head according to the invention, the polarization beam splitting planes 108f and 108g for separating the return beam from the magneto-optical record medium 110 are set to be substantially in parallel with the optical axis of the zero order beam, and therefore an incident angle to the polarization beam splitting planes 108f and 108g can be large. Therefore, the polarization beam splitting planes 108f and 108g can be manufactured easily and the positional adjustment of the semiconductor substrate 101 having the photodetectors formed therein with respect to the beam separating element 108 having the polarization beam splitting planes 108f, 108g can be made simple, and thus a cost of the optical head can be reduced.

Further, the hologram 108e for diffracting the return beam from the magneto-optical record medium 110 and the polarization beam splitting planes 108f, 108g can be integrally formed as the beam separating element 108, and thus the whole construction of the optical head can be made compact, and further these hologram 108e and polarization beam splitting planes 108f, 108g are formed by the plane parallel plates, and therefore the optical system can be manufactured in a mass scale, so that the cost can be further decreased.

The present invention is not limited to the embodiments explained above, but many alternations and modifications may be conceived by those skilled in the art within the scope of the present invention. In the tenth embodiment illustrated in FIGS. 42 and 43, the gratings 108d may be replaced by the hologram 108h like as the eighth embodiment. Further, the hologram 108h may be formed on the upper surface of the hologram element 108a in superimposition with the hologram 108e. Then, the tracking error signal may be derived by the push-pull method.

In the seventh to tenth embodiments, in order to separate the return beam from the magneto-optical record medium by the polarization beam splitting planes 108f, 108g, the half wavelength plates 111a and 111b are arranged in front of the polarization beam splitting planes. The half wavelength plates may be deleted by arranging the beam separating element 108 such that the normal lines with respect to the polarization beam splitting planes 108f, 108g is inclined with respect to the direction x on the x-y plane substantially by 45 degrees like as the fifth embodiment.

In the fifth to tenth embodiments the optical head is formed as the definit optical system, but according to the invention, the optical head may be designed as the indefinite optical system by arranging the collimator lens between the objective lens 109 and the beam separating element 108.

In the fifth to tenth embodiments shown in FIGS. 31 to 43, the diffracting element for diffracting the return beam reflected by the magneto-optical record medium is arranged between the semiconductor laser and the converging means, the polarization beam splitting planes are provided such that these planes are substantially parallel with the optical axis of the zero order beam emanating from the diffracting element, and the diffracted beams emanating from the diffracting element and separated by the polarization beam splitting planes in accordance with the polarizing directions of the beams are made incident upon the photodetectors, and therefore the incident angle of the beams impinging upon the polarization beam splitting planes can be large. This results in that the the polarization beam splitting planes can be formed easily and the positions of the photodetectors and polarization beam splitting planes can be adjusted simply. Moreover, the diffracting element and the beam splitting element can be integrally formed as a single unit, and thus the optical head can be made small in size and compact in construction. Furthermore, the optical head can be advantageously utilized for reading out the information from the magneto-optical record medium.

FIG. 44 is a plan view showing an embodiment of the light emitting and receiving device according to the invention, which can be advantageously used in the optical head according to the invention. The light emitting and receiving device comprises a semiconductor substrate 121 having a surface, in which there are formed four photodetectors 122a to 122d and two recesses 123 and 124. These recesses 123 and 124 are separated from each other by a certain distance and semiconductor lasers 125 and 126 are mounted on bottoms of these recesses, respectively.

The first and second recesses 123 and 124 may be formed by utilizing the etching process well developed in the semiconductor device manufacturing art. Side walls defining the recesses 123 and 124, in FIG. 44 upper side walls 127 and 128 are inclined with respect to the bottoms of the recesses substantially by 45 degrees to form micromirrors.

Laser beams emitted by the semiconductor lasers 125 and 126 in a direction parallel with the plane of the bottoms of the recesses 123 and 124 are reflected by the micromirrors 127 and 128 in a direction substantially perpendicular to the surface of the semiconductor substrate 121. The laser beams are then made incident upon an object such as the magneto-optical record medium and return beams reflected by the object are made incident upon the light emitting and receiving device and are received by the photodetectors 122a to 122d.

As stated above, the first and second recesses 123 and 124 are formed by the etching and thus the micromirrors 127 and 128 can be manufactured very precisely and further the micromirrors 127, 128 can be positioned very precisely with respect to the photodetectors 122a to 122d.

In the light emitting and receiving device according to the invention, the semiconductor lasers 125 and 126 can be mutually positioned precisely by positioning the semiconductor lasers with respect to the micromirrors 127 and 128, and further the semiconductor lasers 125 and 126 can be positioned also precisely with respect to the photodetectors 122a, 122b and 122c, 122d, respectively.

It should be noted that the positional relationship between the first recess 123 and the second recess 124 and the distance between the micromirrors 127, 128 and ends of the semiconductor lasers 125 and 126 are not limited to those shown in FIG. 44, but may be modified at will. By suitably determining these parameters, a plurality of semiconductor lasers may be arranged substantially in a three-dimensional manner.

It should be further noted that instead of changing the distances between the micromirrors 127, 128 and the ends of the semiconductor lasers 125, 125, depths of the first and second recesses 123 and 124 may be changed. Also in this case, a plurality of semiconductor lasers may be arranged substantially in a three-dimensional manner.

FIG. 45 is a plan view shown another embodiment of the light emitting and receiving device according to the invention. The light emitting and receiving device of the present embodiment comprises a semiconductor substrate 131, and a recess 133 is formed in one surface of the semiconductor substrate. Further, in the surface of the semiconductor substrate 131, there are formed two photodetectors 132a and 132b. On a bottom of the recess 133, first and second semiconductor lasers 135 and 136 are mounted, these semiconductor lasers emitting laser beams having different wavelength.

The recess 133 may be formed by the etching widely used in the semiconductor device manufacturing process. One side wall of the recess 133, i.e. a side wall 137 is formed to be inclined by 45 degrees with respect to the surface of the semiconductor substrate 131 to form a micromirror 137. Distances between the micromirror 137 and ends 135a and 136a of the first and second semiconductor lasers 135 and 136 differ from each other, and thus the end face 135a of the first semiconductor laser 135 and the end face 136a of the second semiconductor laser 136 do not position on the same plane.

Laser beams emitted by the first and second semiconductor lasers 125 and 126 in directions parallel with the surface of the semiconductor substrate 131 are reflected by the micromirror 137 in a direction which is perpendicular to the surface of the semiconductor substrate. The return beams reflected by any object are made incident upon the photodetectors 122a and 122b.

When the diverging beams emanating from the light emitting and receiving device are converted into parallel beams by means of the collimator lens, the distances between the end faces 125a and 126a of the semiconductor lasers 125 and 126 can be adjusted independently from each other in accordance with chromatic aberration and curvature of field of the collimator lens such that these laser beams are accurately converted into the parallel beams.

Also in the present embodiment, a plurality of semiconductor lasers may be arranged substantially in a three-dimensional manner by adjusting the distances between the micromirror 137 and the end faces 125a and 126a of the semiconductor lasers 125 and 126 and by a depth in a mounting direction of the semiconductor lasers with the aid of spacers.

Further, the recess 133 is formed by the etching process which has been well developed in the semiconductor device manufacturing field, so that the micromirror 137 can be precisely positioned with respect to the photodetectors 132a and 132b. Therefore, the semiconductor lasers 135 and 136 can be automatically and precisely positioned with respect to the photodetectors 132a and 132b.

In the present embodiment, the two semiconductor lasers are mounted on the recess 133, but more than two semiconductor lasers may be arranged on the recess.

As explained above, in the light emitting and receiving device according to the invention, it is possible to realize the substantially surface emitting laser including a plurality of light emitting points, positions of these light emitting points in a three-dimensional space can be precisely adjusted, and positions of the light emitting points and light receiving points can be mutually adjust also precisely.

What is claimed is:

1. An optical head comprising:
    a semiconductor substrate having a surface;
    a semiconductor laser arranged on said surface of the semiconductor substrate for emitting a laser beam;
    a light receiving means including a plurality of photodetectors formed in said surface of the semiconductor substrate;
    a collimator lens for converting said laser beam emitted by said semiconductor laser into a substantially parallel laser beam;
    an objective lens for converging said substantially parallel laser beam onto a magneto-optical record medium;
    a beam dividing means arranged between said collimator lens and said objective lens for dividing a laser beam reflected by said magneto-optical record medium into first and second return beams; and
    a polarization beam splitting means arranged between said semiconductor laser and said collimator lens such that an integral unit is formed together with said semiconductor substrate, and including gratings for diving the laser beam emitted by said semiconductor laser into a main beam which is used to write or read information on or from said magneto-optical record medium and sub-beams which are used to derive a tracking error signal, a first hologram pattern for diffracting said first return beam, a second hologram pattern for diffracting said second return beam, and a polarization beam splitting plane arranged substantially in parallel with an optical axis of a zero order beam emanating from said second hologram pattern for splitting +1-order and/or −1-order diffracted beam emanating from said second hologram pattern in accordance with a polarizing direction of the beam; whereby +1-order and −1-order diffracted beams emanating from said first hologram pattern and beams emanating from said polarization beam splitting plane are separately received by said plurality of photodetectors of said light receiving means.

2. An optical head comprising:
    a semiconductor substrate having a surface;
    a semiconductor laser arranged on said surface of the semiconductor substrate for emitting a laser beam;

a light receiving means including a plurality of photodetectors formed in said surface of the semiconductor substrate;

a collimator lens for converting said laser beam emitted by said semiconductor laser into a substantially parallel laser beam;

an objective lens for converging said substantially parallel laser beam emanating from said collimator lens onto a magneto-optical record medium;

a beam dividing means arranged between said collimator lens and said objective lens for dividing a laser beam reflected by said magneto-optical record medium into first and second return beams; and a polarization beam splitting means arranged between said semiconductor laser and said collimator lens such that an integral unit is formed together with said semiconductor substrate, and including a first hologram pattern for diffracting said first return beam, a second hologram pattern for diffracting said second return beam, a third hologram pattern for diffracting a zero order beam emanating from said first hologram pattern, and a polarization beam splitting plane arranged substantially in parallel with an optical axis of a zero order beam emanating from said second hologram pattern for splitting +1-order and/or −1-order diffracted beams emanating from said second hologram pattern in accordance with a polarizing direction of the beam; whereby +1-order and −1-order diffracted beams emanating from said first hologram pattern, beams emanating from said polarization beam splitting plane and +1-order and/or −1-order diffracted beam emanating from said third hologram pattern are separately received by said plurality of photodetectors of said light receiving means.

3. An optical head comprising:

a semiconductor substrate having a surface;

a semiconductor laser arranged on said surface of the semiconductor substrate for emitting a laser beam;

a light receiving means including a plurality of photodetectors formed in said surface of the semiconductor substrate;

an objective lens converging the laser beam emitted by said semiconductor laser onto a magneto-optical record medium; and an optical block arranged to form an integral unit together with said semiconductor substrate and including a hologram for diffracting a return beam reflected by said magneto-optical record medium and a polarization beam splitting plane arranged in substantially parallel with an optical axis of a zero order beam emanating from said hologram for splitting a pupil of said hologram; wherein return beams diffracted by said hologram and split by said polarization beam splitting plane are separately received by said plurality of photodetectors of said light receiving means.

4. An optical head comprising:

a semiconductor laser for emitting a laser beam;

a converging means for converging said laser beam emitted by the semiconductor laser onto a magneto-optical record medium;

a light receiving means for receiving a return beam reflected by said magneto-optical record medium and converged by said converging means;

a diffracting means arranged between said semiconductor laser and said converging means for diffracting said return beam reflected by said magneto-optical record medium; and a polarization beam splitting means having a polarization beam splitting plane which is substantially in parallel with an optical axis of a zero order beam of the return beam emanating from said diffracting means and splits diffracted beams emanating from said diffracting means in accordance with polarizing directions of said diffracted beams.

5. A light emitting and receiving device comprising:

a semiconductor substrate having a surface;

a plurality of recesses formed in said surface of the semiconductor substrate;

at least one photodetector formed in said surface of the semiconductor substrate at a position outside said recesses; and a plurality of semiconductor lasers arranged on bottoms of said recesses for emitting laser beams.

6. A light emitting and receiving device according to claim 5, wherein a depth of at least one recess differs from that of the remaining recesses.

7. A light emitting and receiving device according to claim 5, wherein a distance between at least one inclined side wall of a recess and an end surface of a semiconductor laser arranged in the relevant recess differs from a distance between at least one inclined side wall of other recess and an end surface of a semiconductor laser arranged in the relevant recess.

8. A light emitting and receiving device comprising:

a semiconductor substrate having at least one recess formed in one surface thereof;

at least one photodetectors formed in said surface at a position outside said recess; and a plurality of semiconductor lasers arranged on bottoms of said recess for emitting laser beams.

9. A light emitting and receiving device according to claim 8, wherein said semiconductor lasers are arranged on the bottom of said recess such that end surfaces of the semiconductor lasers are not in one and same plane.

* * * * *